(12) United States Patent
Tanzawa

(10) Patent No.: US 11,417,671 B2
(45) Date of Patent: *Aug. 16, 2022

(54) MEMORY DEVICE INCLUDING PASS TRANSISTORS IN MEMORY TIERS

(71) Applicant: Micron Technology, Inc., Boise, ID (US)

(72) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/027,399

(22) Filed: Sep. 21, 2020

(65) Prior Publication Data

US 2021/0035995 A1    Feb. 4, 2021

Related U.S. Application Data

(60) Continuation of application No. 16/228,574, filed on Dec. 20, 2018, now Pat. No. 10,784,269, which is a
(Continued)

(51) Int. Cl.
| | |
|---|---|
| *G11C 16/04* | (2006.01) |
| *H01L 27/11526* | (2017.01) |
| *H01L 27/11524* | (2017.01) |
| *H01L 27/1157* | (2017.01) |
| *H01L 27/11556* | (2017.01) |

(Continued)

(52) U.S. Cl.
CPC ........ *H01L 27/11526* (2013.01); *G11C 16/04* (2013.01); *G11C 16/10* (2013.01); *G11C 16/26* (2013.01); *H01L 27/1157* (2013.01); *H01L 27/11524* (2013.01); *H01L 27/11556* (2013.01); *H01L 27/11573* (2013.01); *H01L 27/11575* (2013.01); *H01L 27/11582* (2013.01); *G11C 8/12* (2013.01); *G11C 16/0483* (2013.01); *G11C 16/08* (2013.01)

(58) Field of Classification Search
CPC ...................................................... G11C 5/025
USPC .................................................. 365/230.06
See application file for complete search history.

(56) References Cited

U.S. PATENT DOCUMENTS

| | | |
|---|---|---|
| 5,818,083 A | 10/1998 | Ito |
| 6,442,072 B2 | 8/2002 | Solimene |

(Continued)

OTHER PUBLICATIONS

U.S. Appl. No. 15/450,638 U.S. Pat. No. 10,170,490, filed Mar. 6, 2017, Memory Device Including Pass Transistors in Memory Tiers.
(Continued)

*Primary Examiner* — Min Huang
(74) *Attorney, Agent, or Firm* — Schwegman Lundberg & Woessner, P.A.

(57) ABSTRACT

Some embodiments include apparatuses and methods of using such apparatuses. One of the apparatuses includes a semiconductor material, a pillar extending through the semiconductor material, a select gate located along a first portion of the pillar, memory cells located along a second portion of the pillar, and transistors coupled to the select gate through a portion of the semiconductor material. The transistors include sources and drains formed from portions of the semiconductor material. The transistors include gates that are electrically uncoupled to each other.

20 Claims, 17 Drawing Sheets

Related U.S. Application Data division of application No. 15/450,638, filed on Mar. 6, 2017, now Pat. No. 10,170,490.

(51) Int. Cl.
*H01L 27/11582* (2017.01)
*G11C 16/26* (2006.01)
*G11C 16/10* (2006.01)
*H01L 27/11573* (2017.01)
*H01L 27/11575* (2017.01)
*G11C 8/12* (2006.01)
*G11C 16/08* (2006.01)

(56) References Cited

U.S. PATENT DOCUMENTS

| | | | |
|---|---|---|---|
| 7,936,004 B2 | 5/2011 | Kito et al. | |
| 8,860,117 B2 | 10/2014 | Tanzawa | |
| 10,170,490 B2* | 1/2019 | Tanzawa | G11C 16/04 |
| 10,784,269 B2* | 9/2020 | Tanzawa | H01L 27/11582 |
| 2008/0112209 A1 | 5/2008 | Cho et al. | |
| 2008/0253183 A1 | 10/2008 | Mizukami et al. | |
| 2012/0120725 A1* | 5/2012 | Ahn | H01L 27/11524 365/185.02 |
| 2013/0223142 A1* | 8/2013 | Park | H01L 27/11582 365/184 |
| 2013/0329500 A1 | 12/2013 | Han et al. | |
| 2014/0241026 A1 | 8/2014 | Tanzawa | |
| 2015/0357342 A1* | 12/2015 | Lee | H01L 27/11582 257/324 |
| 2016/0268304 A1 | 9/2016 | Ikeda et al. | |
| 2018/0254282 A1 | 9/2018 | Tanzawa | |
| 2019/0123058 A1 | 4/2019 | Tanzawa | |

OTHER PUBLICATIONS

U.S. Appl. No. 16/228,574 U.S. Pat. No. 10,784,269, filed Dec. 20, 2018, Memory Device Including Pass Transistors in Memory Tiers.

Jang, J., et al., "Vertical cell array using TCAT(Terabit Cell Array Transistor) technology for ultra high density NAND flash memory", Symposium on VLSI Technology, (2009), 192-193.

Katsumata, R., et al., "Pipe-shaped BiCS flash memory with 16 stacked layers and multi-level-cell operation for ultra high density storage devices", Symposium on VLSI Technology, (Jun. 2009), 136-37.

Kim, J., et al., "Novel Vertical-Stacked Array-Transistor (VSAT) for ultra-high-density and cost-effective NAND Flash memory devices and SSD (Solid State Drive)", Symposium on VLSI Technology, (2009), 186-187.

Kim, W., et al., "Multi-layered Vertical Gate NAND Flash overcoming stacking limit for terabit density storage", Symposium on VLSI Technology, (2009), 188-89.

\* cited by examiner

|  | SEL$_A$ | SEL$_B$ | SEL$_C$ |
|---|---|---|---|
| BLOCK 0 | SEL$_1$ | SEL$_2$ | SEL$_3$ |
| BLOCK 1 | SEL$_1$ | SEL$_2$ | SEL*$_3$ |
| BLOCK 2 | SEL$_1$ | SEL*$_2$ | SEL$_3$ |
| BLOCK 3 | SEL$_1$ | SEL*$_2$ | SEL*$_3$ |
| BLOCK 4 | SEL*$_1$ | SEL$_2$ | SEL$_3$ |
| BLOCK 5 | SEL*$_1$ | SEL$_2$ | SEL*$_3$ |
| BLOCK 6 | SEL*$_1$ | SEL*$_2$ | SEL$_3$ |
| BLOCK 7 | SEL*$_1$ | SEL*$_2$ | SEL*$_3$ |

| SEL$_1$ | SEL*$_1$ | SEL$_2$ | SEL*$_2$ | SEL$_3$ | SEL*$_3$ |
|---|---|---|---|---|---|
| V1 | V0 | V1 | V0 | V1 | V0 |
| V0 | V1 | V0 | V1 | V0 | V1 |

FIG. 2C

|  |  | SEL$_C$ | SEL$_B$ | SEL$_A$ |
|---|---|---|---|---|
| SELECTED | BLOCK 0 | V1 | V1 | V1 |
| UNSELECTED | BLOCK 1 | V1 | V1 | V0 |
| UNSELECTED | BLOCK 2 | V1 | V0 | V1 |
| UNSELECTED | BLOCK 3 | V1 | V0 | V0 |
| UNSELECTED | BLOCK 4 | V0 | V1 | V1 |
| UNSELECTED | BLOCK 5 | V0 | V1 | V0 |
| UNSELECTED | BLOCK 6 | V0 | V0 | V1 |
| UNSELECTED | BLOCK 7 | V0 | V0 | V0 |

301
FIG. 3A

|  |  | SEL$_C$ | SEL$_B$ | SEL$_A$ |
|---|---|---|---|---|
| UNSELECTED | BLOCK 0 | V1 | V1 | V0 |
| SELECTED | BLOCK 1 | V1 | V1 | V1 |
| UNSELECTED | BLOCK 2 | V1 | V0 | V0 |
| UNSELECTED | BLOCK 3 | V1 | V0 | V1 |
| UNSELECTED | BLOCK 4 | V0 | V1 | V0 |
| UNSELECTED | BLOCK 5 | V0 | V1 | V1 |
| UNSELECTED | BLOCK 6 | V0 | V0 | V0 |
| UNSELECTED | BLOCK 7 | V0 | V0 | V1 |

302
FIG. 3B

|  |  | SEL$_C$ | SEL$_B$ | SEL$_A$ |
|---|---|---|---|---|
| UNSELECTED | BLOCK 0 | V0 | V1 | V1 |
| UNSELECTED | BLOCK 1 | V0 | V1 | V0 |
| UNSELECTED | BLOCK 2 | V0 | V0 | V1 |
| UNSELECTED | BLOCK 3 | V0 | V0 | V0 |
| SELECTED | BLOCK 4 | V1 | V1 | V1 |
| UNSELECTED | BLOCK 5 | V1 | V1 | V0 |
| UNSELECTED | BLOCK 6 | V1 | V0 | V1 |
| UNSELECTED | BLOCK 7 | V1 | V0 | V0 |

303
FIG. 3C

|  | $SEL_A$ | $SEL_B$ | $SEL_C$ | $SEL_D$ |
|---|---|---|---|---|
| BLOCK 0 | $SEL_1$ | $SEL_2$ | $SEL_3$ | $SEL_4$ |
| BLOCK 1 | $SEL_1$ | $SEL_2$ | $SEL_3$ | $SEL_4^*$ |
| BLOCK 2 | $SEL_1$ | $SEL_2$ | $SEL_3^*$ | $SEL_4$ |
| BLOCK 3 | $SEL_1$ | $SEL_2$ | $SEL_3^*$ | $SEL_4^*$ |
| BLOCK 4 | $SEL_1$ | $SEL_2^*$ | $SEL_3$ | $SEL_4$ |
| BLOCK 5 | $SEL_1$ | $SEL_2^*$ | $SEL_3$ | $SEL_4^*$ |
| BLOCK 6 | $SEL_1$ | $SEL_2^*$ | $SEL_3^*$ | $SEL_4$ |
| BLOCK 7 | $SEL_1$ | $SEL_2^*$ | $SEL_3^*$ | $SEL_4^*$ |
| BLOCK 8 | $SEL_1^*$ | $SEL_2$ | $SEL_3$ | $SEL_4$ |
| BLOCK 9 | $SEL_1^*$ | $SEL_2$ | $SEL_3$ | $SEL_4^*$ |
| BLOCK 10 | $SEL_1^*$ | $SEL_2$ | $SEL_3^*$ | $SEL_4$ |
| BLOCK 11 | $SEL_1^*$ | $SEL_2$ | $SEL_3^*$ | $SEL_4^*$ |
| BLOCK 12 | $SEL_1^*$ | $SEL_2^*$ | $SEL_3$ | $SEL_4$ |
| BLOCK 13 | $SEL_1^*$ | $SEL_2^*$ | $SEL_3$ | $SEL_4^*$ |
| BLOCK 14 | $SEL_1^*$ | $SEL_2^*$ | $SEL_3^*$ | $SEL_4$ |
| BLOCK 15 | $SEL_1^*$ | $SEL_2^*$ | $SEL_3^*$ | $SEL_4^*$ |

| $SEL_1$ | $SEL_1^*$ | $SEL_2$ | $SEL_2^*$ | $SEL_3$ | $SEL_3^*$ | $SEL_4$ | $SEL_4^*$ |
|---|---|---|---|---|---|---|---|
| V1 | V0 | V1 | V0 | V1 | V0 | V1 | V0 |
| V0 | V1 | V0 | V1 | V0 | V1 | V0 | V1 |

FIG. 4C

| | NUMBER OF BLOCKS | NUMBER OF TRANSISTOR GATE LINES IN EACH BLOCK | NUMBER OF SWITCHES |
|---|---|---|---|
| 502 → | $8 = 2^3$ | 3 | $6 = 2 \times 3$ |
| 504 → | $16 = 2^4$ | 4 | $8 = 2 \times 4$ |
| 506 → | $8 = 2^T$ | T | $S = 2 \times T$ |

FIG. 5

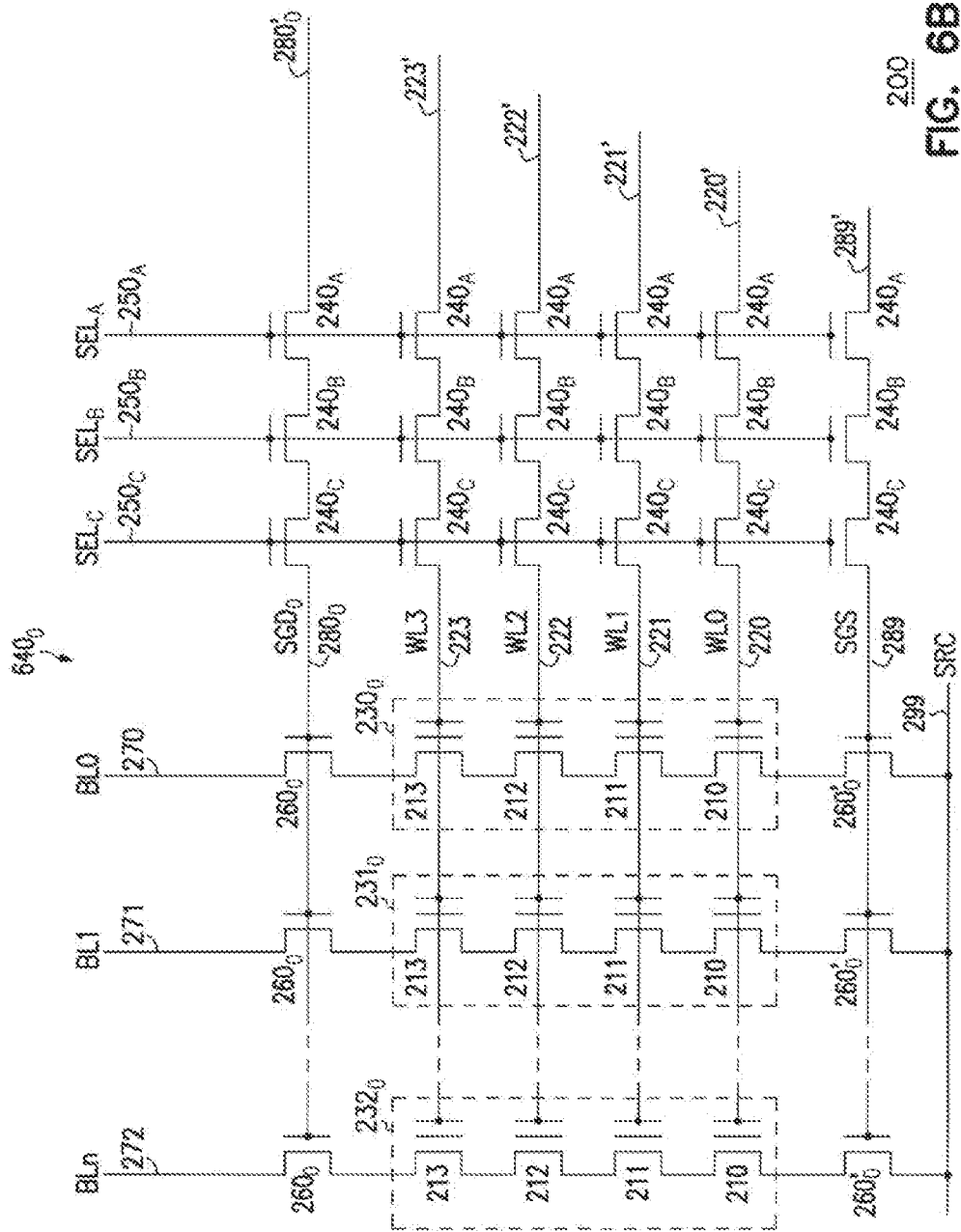

MEMORY DEVICE INCLUDING PASS TRANSISTORS IN MEMORY TIERS

PRIORITY APPLICATION

This application is a continuation of U.S. application Ser. No. 16/228,574, filed Dec. 20, 2018, which is a divisional of U.S. application Ser. No. 15/450,638, filed Mar. 6, 2017, now issued as U.S. Pat. No. 10,170,490, all of which are incorporated herein by reference in their entirety.

BACKGROUND

Memory devices are widely used in computers and many other electronic items to store information. Some conventional memory devices have memory cells that are organized in blocks with sub-blocks within each block. As storage density increases for a given device area, the number of sub-blocks in some conventional memory devices may increase. An increase in the number of sub-blocks may hinder the performance of some conventional memory devices.

BRIEF DESCRIPTION OF THE DRAWINGS

FIG. 2B is a chart showing unique combinations of signals based on a mapping of signals of each of the blocks of the memory device of FIG. 2A, according to some embodiments described herein.

FIG. 2C is a chart illustrating relationships between voltages provided to the signals of the blocks of the memory device of FIG. 2A, according to some embodiments described herein.

FIG. 3A, FIG. 3B, and FIG. 3C are charts showing examples of different unique combinations of voltages provided to the signals of the blocks of the memory device of FIG. 2A if different blocks are selected during different example memory operations of the memory device of FIG. 2A, according to some embodiments described herein.

FIG. 4B is a chart showing unique combinations of signals based on a mapping of signals of each of the blocks of the memory device of FIG. 4A, according to some embodiments described herein.

FIG. 4C is a chart illustrating relationships between voltages provided to the signals of the blocks of the memory device of FIG. 4A, according to some embodiments described herein.

FIG. 5 is a chart showing relationships between the numbers of blocks, transistor gate lines in each block, and switches in a memory device, according to some embodiments described herein.

FIG. 6B, FIG. 6C, FIG. 6D, and FIG. 6E show schematic diagrams of different sub-blocks of the block of the memory device of FIG. 6A, according to some embodiments described herein.

DETAILED DESCRIPTION

Figure 1:
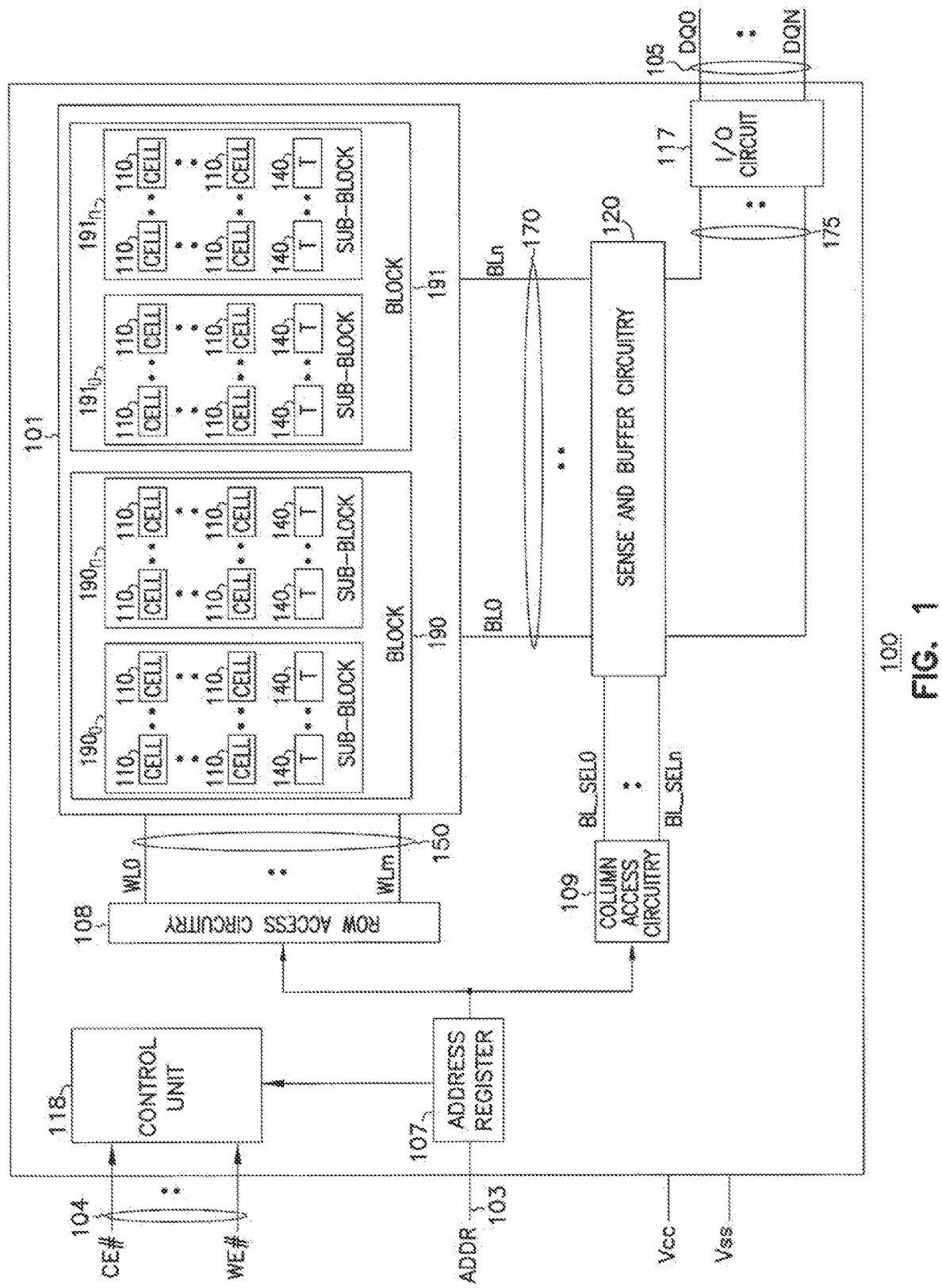
FIG. 1 shows a block diagram of an apparatus in the form of a memory device including memory cells and pass transistors formed in the same memory array, according to some embodiments described herein.

FIG. 1 shows a block diagram of an apparatus in the form of a memory device 100 including memory cells and pass transistors formed in the same memory array (memory cell array), according to some embodiments described herein. Memory device 100 can include a memory array (or multiple memory arrays) 101 containing memory cells 110. In the physical structure of memory device 100, memory cells 110 can be arranged vertically (e.g., stacked over each other) over a substrate of memory device 100 (e.g., a semiconductor substrate of an IC chip that includes memory device 100). Memory cells 110 can include non-volatile cells. For example, memory cells 110 can include floating gate memory cells, charge trap memory cells, or other types of non-volatile memory cells.

As shown in FIG. 1, memory cells 110 can be arranged in blocks (memory cell blocks), such as blocks 190 and 191. Each of blocks 190 and 191 can include sub-blocks. For example, block 190 can include sub-blocks $190_0$ and $190_n$, and block 191 can include sub-blocks $191_0$ and $191_n$. Each of sub-blocks $190_0$, $190_n$, $191_0$, and $191_n$ can include a combination of memory cells 110. FIG. 1 shows memory device 100 having two blocks 190 and 191 and two sub-blocks in each of blocks 190 and 191 as an example. Memory device 100 can have more than two blocks and more than two sub-blocks in each of the blocks.

As shown in FIG. 1, memory device 100 can include transistors (labeled as "Ts") 140 in the sub-blocks of each of blocks 190 and 191. Transistors 140 can be formed in the same memory array over the substrate of memory device 100 where memory cells 110 are formed. Transistors 140 can operate as pass transistors to provide signals to respective blocks (e.g., blocks 190 and 191) of memory device 100. Transistors 140 can include the transistors described in more detail with reference to FIG. 2A through FIG. 8.

As shown in FIG. 1, memory device 100 can include access lines (which can include word lines) 150 and data lines (which can include bit lines) 170. Access lines 150 can carry signals (e.g., word line signals) WL0 through WLm. Data lines 170 can carry signals (e.g., bit line signals) BL0 through BLn. Memory device 100 can use access lines 150 to selectively access sub-blocks $190_0$, $190_n$, $191_0$, and $191_n$ of blocks 190 and 191 and data lines 170 to selectively exchange information (e.g., data) with memory cells 110 of blocks 190 and 191.

Memory device 100 can include an address register 107 to receive address information (e.g., address signals) ADDR on lines (e.g., address lines) 103. Memory device 100 can include row access circuitry 108 and column access circuitry 109 (e.g., part of decoder circuitry of memory device 100) that can decode address information from address register 107. Based on decoded address information, memory device 100 can determine which memory cells 110 of which sub-blocks of blocks 190 and 191 are to be accessed during a memory operation. Memory device 100 can perform a read operation to read (e.g., sense) information (e.g., previously stored information) in memory cells 110, or a write (e.g., program) operation to store (e.g., program) information in memory cells 110. Memory device 100 can use data lines 170 associated with signals BL0 through BLn to provide information to be stored in memory cells 110 or obtain information read (e.g., sensed) from memory cells 110. Memory device 100 can also perform an erase operation to erase information from some or all of memory cells 110 of blocks 190 and 191.

Memory device 100 can include a control unit 118 (which can include components such as a state machine (e.g., finite state machine), register circuits, and other components) configured to control memory operations (e.g., read, write, and erase operations) of memory device 100 based on control signals on lines 104. Examples of the control signals on lines 104 include one or more clock signals and other signals (e.g., a chip-enable signal CE #, a write-enable signal WE #) to indicate which operation (e.g., read, write, or erase operation) memory device 100 can perform.

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 110 (e.g., during a read operation) of blocks 190 and 191 and provide the value of the information to lines (e.g., global data lines) 175. Sense and buffer circuitry 120 can also be configured to use signals on lines 175 to determine the value of information to be stored (e.g., programmed) in memory cells 110 of blocks 190 and 191 (e.g., during a write operation) based on the values (e.g., voltage values) of signals on lines 175 (e.g., during a write operation).

Memory device 100 can include input/output (I/O) circuitry 117 to exchange information between memory cells 110 of blocks 190 and 191 and lines (e.g., I/O lines) 105. Signals DQ0 through DQN on lines 105 can represent information read from or stored in memory cells 110 of blocks 190 and 191. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 110 can be programmed to store information representing a value of at most a single bit, or a value of multiple bits such as two, three, four, or another number of bits. For example, each of memory cells 110 can be programmed to store information representing a binary value "0" or "1" of a single bit. The single bit per cell is sometimes called a single-level cell. In another example, each of memory cells 110 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can include a non-volatile memory device, such that memory cells 110 can retain information stored thereon when power (e.g., voltage Vcc, Vss, or both) is disconnected from memory device 100. For example, memory device 100 can be a flash memory device, such as a NAND flash (e.g., 3-directional (3-D) NAND) or a NOR flash memory device, or another kind of memory device, such as a variable resistance memory device (e.g., a phase change memory device or a resistive RAM (Random Access Memory) device). One of ordinary skill in the art may recognize that memory device 100 may include other components, several of which are not shown in FIG. 1 so as not to obscure the example embodiments described herein.

At least a portion of memory device 100 can include structures and perform operations similar to or identical to the structures and operations of any of the memory devices described below with reference to FIG. 2A through FIG. 8.

Structuring and operating a memory device (e.g., memory device 100) as described herein allows the memory device to have improvements over some conventional memory devices. Such improvements include a lower number of sub-blocks, a lower number of pages per block, and a higher number of blocks for a given device area (e.g., pitch area). In comparison with some conventional memory devices, these improvements can lead to a lower energy consumption for charging access lines (e.g., word lines) during memory operations (e.g., read and write operations) and shorter time for some other memory operations (e.g., garbage collection operations) of memory device 100.

Figure 2A:
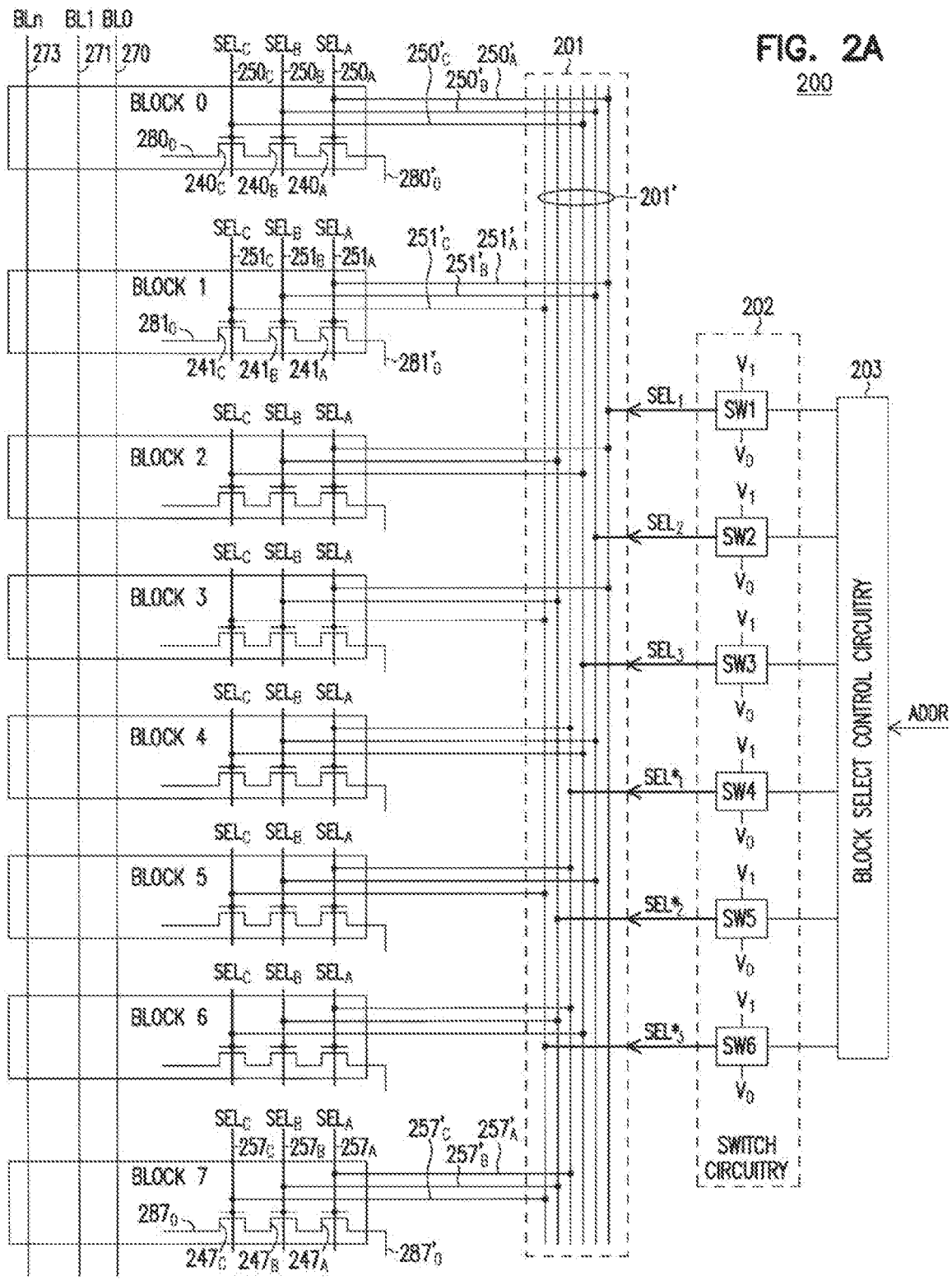
FIG. 2A shows a block diagram of a portion of a memory device including memory cell blocks and associated transistors, according to some embodiments described herein.

FIG. 2A shows a block diagram of a portion of a memory device 200 including block 0 through block 7 (memory cell blocks) and associated transistors, according to some embodiments described herein. Memory device 200 can also include data lines (e.g., bit lines) 270, 271, and 272 to carry respective signals (e.g., bit line signals) BL0, BL1, and BLn, routing circuitry 201, switch circuitry 202, and block select control circuitry 203. Memory device 200 can correspond to memory device 100, such that block 0 through block 7 can correspond to the blocks (e.g., block 190 and 191) of memory device 100 of FIG. 1. FIG. 2A shows memory device 200 including eight blocks 0 through 7 as an example. However, memory device 200 can include numerous blocks (e.g., hundreds or thousands of blocks).

Block 0 through block 7 share data lines 270, 271, and 272. During a memory operation (e.g., read or write operation) of memory device 200, only one block (e.g., a selected block) among block 0 through block 7 can be selected at a time. The selected block can exchange information (e.g., data) with data lines 270, 271, and 272. The blocks that are not selected are called unselected (e.g., deselected) blocks. For example, if block 0 is selected, then block 1 through block 7 are unselected (e.g., deselected) blocks. In another example, if block 1 is selected, then block 0 and block 2 through block 7 are unselected blocks.

In this description, a selected block is a block that is selected by memory device 200 to store information in (e.g., in a write operation) or read information from (e.g., in a read operation) a memory cell (or memory cells) of that selected block. An unselected block is a block that is not selected by memory device 200 during a memory operation. During a memory operation (e.g., performed on a selected block), information may not be stored in or read from memory cells of an unselected block.

For simplicity, the following description focuses on block 0 and its associated components. Other blocks (e.g., block 1 through block 7) of memory device 200 have structures and operations similar to that of block 0. The description of block 1 through block 7 follows the description of block 0.

As shown in FIG. 2A, block 0 can include transistors $240_A$, $240_B$, and $240_C$ coupled in series with each other and coupled in series between a select line $280_0$ and a select line $280'_0$. Transistors $240_A$, $240_B$, and $240_C$ can be field effect transistors (FETs). Select line $280_0$ can be one of local select lines (e.g., conductive lines that are mainly located in a memory cell array) of block 0. Select line $280'_0$ can be one of global select lines (e.g., conductive lines that are mainly located outside a memory cell array) of block 0. Memory device 200 can provide a signal (e.g., voltage signal) to a global select line (e.g., $280'_0$). Transistors $240_A$, $240_B$, and $240_C$ can be controlled (e.g., turned on) to pass the signal from the global select line (e.g., $280'_0$) to a corresponding local select line (e.g., $280_0$) if block 0 is a selected block. Thus, transistors $240_A$, $240_B$, and $240_C$ can be called pass transistors. Controlling of transistors $240_A$, $240_B$, and $240_C$ can be based on decoding of information ADDR (e.g., address information). Thus, transistors $240_A$, $240_B$, and $240_C$ can be alternatively called decoding transistors. Transistors $240_A$, $240_B$, and $240_C$ can correspond to some of transistors 140 in one of blocks 190 and 191 of memory device of FIG. 1.

In FIG. 2A, block 0 also includes additional pass transistors (not shown in FIG. 2A for simplicity) similar to transistors $240_A$, $240_B$, and $240_C$. Detailed description of the pass transistors (e.g., transistors $240_A$, $240_B$, and $240_C$ and the additional pass transistors) and other components of block 0 is discussed below with reference to FIG. 6A through FIG. 7E.

In FIG. 2A, memory device 200 can use select line $280_0$ to control (e.g., turn on or turn off) a select gate (not shown in FIG. 2A) of block 0 in order to couple memory cell strings (not shown) of block 0 to respective data lines 270, 271, and 272 during memory operation if block 0 is a selected block. During a memory operation of memory device 200, all of transistors $240_A$, $240_B$, and $240_C$ can be turned on to form a conductive path (e.g., current path) between select lines $280_0$ and $280'_0$ (through the turned-on transistors $240_A$, $240_B$, and $240_C$) if block 0 is a selected block. The conductive path allows a signal provided on select line (e.g., global select line) $280'_0$ to be passed to select line (e.g., local select line) $280_0$ in order to turn on the select gate (not shown) of block 0. Turning on the select gate is part of a memory operation of storing information in or reading information from memory cells of the selected block (e.g., block 0). In FIG. 2A, at least one (meaning one, two, or all three) of transistors $240_A$, $240_B$, and $240_C$ can be turned off in order not to form a conductive path (e.g., break a conductive path) between select lines $280_0$ and $280'_0$ if block 0 is an unselected (e.g., deselected) block during a memory operation of memory device 200.

As shown in FIG. 2A, block 0 can include separate transistor gate lines $250_A$, $250_B$, and $250_C$ that can carry respective signals (e.g., block select signals) $SEL_A$, $SEL_B$, and $SEL_C$. Transistor gate lines $250_A$, $250_B$, and $250_C$ can be structured as conductive lines that are electrically uncoupled to each other. In this description, "electrically uncoupled to each other" means "not electrically coupled to each other". Transistors $240_A$, $240_B$, and $240_C$ can have separate gates (transistor gates that are electrically uncoupled to each other) coupled to respective transistor gate lines $250_A$, $250_B$, and $250_C$. Memory device 200 can use transistor gate lines $250_A$, $250_B$, and $250_C$ to control (e.g., turn on or turn off) respective transistors $240_A$, $240_B$, and $240_C$.

Signals $SEL_A$, $SEL_B$, and $SEL_C$ can be provided with different voltage values, depending on whether block 0 is a selected block during a memory operation of memory device 200. For example, each of signals $SEL_A$, $SEL_B$, and $SEL_C$ can be provided with a voltage (e.g., a positive voltage) to turn on all of transistors $240_A$, $240_B$, and $240_C$ in order to form a conductive path between select lines $280_0$ and $280'_0$ if block 0 is a selected block during that memory operation. In another example, at least one of signals $SEL_A$, $SEL_B$, and $SEL_C$ can be provided with another voltage (e.g., zero volts (ground) or alternatively a negative voltage) to turn off at least one of transistors $240_A$, $240_B$, and $240_C$ in order not to form (e.g., or to break) a conductive path between select lines $280_0$ and $280'_0$ if block 0 is an unselected block during that memory operation.

As shown in FIG. 2A, routing circuitry 201 can include conductive lines 201' and conductive connections $250'_A$, $250'_B$, and $250'_C$ coupled to conductive lines 201' and to respective transistor gate lines $250_A$, $250_B$, and $250_C$ of block 0. The values of voltages provided to signals $SEL_A$, $SEL_B$, and $SEL_C$ on respective transistor gate lines $250_A$, $250_B$, and $250_C$ are based on the values of voltages provided to signals $SEL_1$, $SEL_2$, $SEL_3$, $SEL^*_1$, $SEL^*_2$, and $SEL^*_3$ carried by conductive lines 201'. FIG. 2B (described below) shows mapping between signals $SEL_A$, $SEL_B$, and $SEL_C$ and signals $SEL_1$, $SEL_2$, $SEL_3$, $SEL^*_1$, $SEL^*_2$, and $SEL^*_3$ of FIG. 2A.

In FIG. 2A, switch circuitry 202 can operate to selectively provide different voltages to signals $SEL_1$, $SEL_2$, $SEL_3$, $SEL^*_1$, $SEL^*_2$, and $SEL^*_3$, depending on which block among block 0 through block 7 is selected during a memory operation. Switch circuitry 202 can include switches SW1 through SW6. Each of switches SW1 through SW6 can operate to provide either a voltage V0 or a voltage V1 to a respective signal among signals $SEL_1$, $SEL_2$, $SEL_3$, $SEL^*_1$, $SEL^*_2$, and $SEL^*_3$. For example, switch SW1 can provide either voltage V0 or voltage V1 to signal $SEL_1$. In another example, switch SW4 can to provide either voltage V0 or voltage V1 to signal $SEL^*_1$. The value of voltage V0 is less than the value of voltage V1. Voltage V0 can be zero or can have a negative value (that can cause transistors $240_A$, $240_B$, and $240_C$ to turn off). Voltage V1 can have a positive value (that can cause transistors $240_A$, $240_B$, and $240_C$ to turn on).

Switches SW1 and SW4 can operate such that signal $SEL_1$ (provided at the output node of switch SW1) and signal $SEL^*_1$ (provided at the output node of switch SW4) can have different voltages (e.g., V0 and V1, respectively, or V1 and V0, respectively) during the same time interval of a memory operation of memory device 200. For example, if signal $SEL_1$ is provided with voltage V0 during a particular time interval, then signal $SEL^*_1$ is provided with voltage V1 during that particular time interval. In another example, if signal $SEL_1$ is provided with voltage V1 during a particular time interval, then signal $SEL^*_1$ is provided with voltage V0 during that particular time interval.

Similarly, switches SW2 and SW5 can operate such that signals $SEL_2$ and $SEL^*_2$ can have different voltages (e.g., V0 and V1, respectively, or V1 and V0, respectively) during a particular time interval of a memory operation of memory device 200. Switches SW3 and SW6 can operate such that signals $SEL_3$ and $SEL^*_3$ can have different voltages (e.g., V0 and V1, respectively, or V1 and V0, respectively) during a particular time interval of a memory operation of memory device 200.

Block select control circuitry 203 can control switches SW1 through SW6 based on information ADDR in order to cause each of switches SW1 through SW6 to provide either voltage V0 or V1 (e.g., based on decoding of information ADDR by block select control circuitry 203). Information ADDR can be provided by an address register of memory device 100 (e.g., similar to address register 107 of FIG. 1). In FIG. 2A, controlling switches SW1 through SW6 can include causing each of switches SW1 through SW6 to couple its output node (e.g., a node that provides one of signals $SEL_1$, $SEL_2$, $SEL_3$, $SEL^*_1$, $SEL^*_2$, and $SEL^*_3$) to either the node that has voltage V0 or the node that has voltage V1.

Information ADDR can have a value (e.g., a value of a combination of bits) indicate which block among block 0 through block 7 is selected during a memory operation. For example, information ADDR can have one value if block 0 is selected and another value if block 1 is selected, and so on.

The above description concentrates on block 0 of memory device 200 in FIG. 2A. Similarly, each of block 1 through block 7 of memory device 200 has structures and operations similar to that of block 0 described above.

For example, as shown in FIG. 2A, block 1 can include transistors (e.g., pass transistors) $241_A$, $241_B$, and $241_C$ coupled in series with each other and coupled in series between a select line $281_0$ (e.g., one of local select lines of block 1) and a select line $281'_0$ (e.g., one of the global select lines of block 1). Memory device 200 can use select line $281_0$ to control a select gate (not shown) of block 1 in order to couple memory cell strings (not shown) of block 1 to respective data lines 270, 271, and 272 during a memory operation if block 1 is a selected block.

Block 1 can include separate transistor gate lines $251_A$, $251_B$, and $251_C$ (conductive lines that are electrically uncoupled to each other) that can carry respective signals $SEL_A$, $SEL_B$, and $SEL_C$, which are different from signals $SEL_A$, $SEL_B$, and $SEL_C$ of block 0. Transistors $241_A$, $241_B$, and $241_C$ can have separate gates (transistor gates that are electrically uncoupled to each other) coupled to respective transistor gate lines $251_A$, $251_B$, and $251_C$. Memory device 200 can use transistor gate lines $251_A$, $251_B$, and $251_C$ to control (e.g., turn on or turn off) respective transistors $241_A$, $241_B$, and $241_C$. During a memory operation of memory device 200, all of transistors $241_A$, $241_B$, and $241_C$ can be turned on to form a conductive path (e.g., current path) between select lines $281_0$ and $281'_0$ (through the turned-on transistors $241_A$, $241_B$, and $241_C$) if block 1 is a selected block. At least one of transistors $241_A$, $241_B$, and $241_C$ can be turned off in order not to form a conductive path (e.g., break a conductive path) between select lines $281_0$ and $281'_0$ if block 1 is an unselected (e.g., deselected) block during a memory operation of memory device 200.

In another example shown in FIG. 2A, block 7 can include transistors $247_A$, $247_B$, and $247_C$ (e.g., pass transistors) coupled in series with each other and coupled in series between a select line $287_0$ (e.g., one of the local select lines of block 7) and a select line $287'_0$ (e.g., one of the global select lines of block 7). Memory device 200 can use select line $287_0$ to control a select gate (not shown) of block 7 in order to couple memory cell strings (not shown) of block 7 to respective data lines 270, 271, and 272.

Block 7 can include separate transistor gate lines $257_A$, $257_B$, and $257_C$ (conductive lines that are electrically uncoupled to each other) that can carry respective signals $SEL_A$, $SEL_B$, and $SEL_C$, which are different from signals $SEL_A$, $SEL_B$, and $SEL_C$ of block 0 and block 1. Transistors $247_A$, $247_B$, and $247_C$ can have separate gates (transistor gates that are electrically uncoupled to each other) coupled to respective transistor gate lines $257_A$, $257_B$, and $257_C$. Memory device 200 can use transistor gate lines $257_A$, $257_B$, and $257_C$ to control (e.g., turn on or turn off) respective transistors $247_A$, $247_B$, and $247_C$. During a memory operation of memory device 200, all of transistors $247_A$, $247_B$, and $247_C$ can be turned on to form a conductive path (e.g., current path) between select lines $287_0$ and $287'_0$ (through the turned-on transistors $247_A$, $247_B$, and $247_C$) if block 7 is a selected block. At least one of transistors $247_A$, $247_B$, and $247_C$ can be turned off in order not to form a conductive path (e.g., break a conductive path) between select lines $287_0$ and $287'_0$ if block 7 is an unselected (e.g., deselected) block during a memory operation of memory device 200.

As shown in FIG. 2A, transistor select lines (e.g., $250_A$, $250_B$, and $250_C$) of one block (e.g., block 0) are separate from (e.g., electrically uncoupled to) transistor select lines (e.g., $251_A$, $251_B$, and $251_C$) of another block (e.g., block 1). For simplicity, the same labels (e.g., $SEL_A$, $SEL_B$, and $SEL_C$) are given for the signals (e.g., signals $SEL_A$, $SEL_B$, and $SEL_C$) provided to transistor gate lines of block 0 through block 7. However, during a memory operation of memory device 200, signals $SEL_A$, $SEL_B$, and $SEL_C$ of one block (e.g., block 0) are provided with voltages different from the voltages provided to signals $SEL_A$, $SEL_B$, and $SEL_C$ of other blocks (e.g., block 1 through block 7). This difference in voltages allows all of the pass transistors of only one of block 0 through block 7 (e.g., a selected block) to be turned on during a memory operation of memory device 200, so that only one of block 0 through block 7 can be allowed to exchange information with data lines 270, 271, and 272 during that memory operation.

FIG. 2B is a chart (e.g., table) 245 showing a unique combination of signals based on a mapping of signals $SEL_A$, $SEL_B$, and $SEL_C$ of each of block 0 through block 7 and respectively signals $SEL_1$, $SEL_2$, $SEL_3$, $SEL^*_1$, $SEL^*_2$, and $SEL^*_3$, according to some embodiments described herein. The physical connections between transistor gate lines (e.g., $250_A$, $250_B$, and $250_C$) of each of block 0 through block 7 and conductive lines 201' of routing circuitry 201 in FIG. 2A can be based on the mapping shown in chart 245 of FIG. 2B.

FIG. 2B shows an example of eight unique combinations of six different signals $SEL_1$, $SEL_2$, $SEL_3$, $SEL^*_1$, $SEL^*_2$, and $SEL^*_3$. Signals $SEL_A$, $SEL_B$, and $SEL_C$ of each of block 0 through block 7 can be mapped (e.g., assigned) to a unique combination of signals $SEL_1$, $SEL_2$, $SEL_3$, $SEL^*_1$, $SEL^*_2$, and $SEL^*_3$. For example, signals $SEL_A$, $SEL_B$, and $SEL_C$ of block 0 can be mapped to signals $SEL_1$, $SEL_2$, and $SEL_3$. In another example, signals $SEL_A$, $SEL_B$, and $SEL_C$ of block 1 can be mapped to signals $SEL_1$, $SEL_2$, and $SEL^*_3$. In a further example, signals $SEL_A$, $SEL_B$, and $SEL_C$ of block 2 can be mapped to signals $SEL_1$, $SEL^*_2$, and $SEL_3$. As described above, during a memory operation of memory device 200, signals $SEL_1$ and $SEL^*_1$ can be provided with different voltages (e.g., V0 and V1), signals $SEL_2$ and $SEL*_2$ can be provided with different voltages (e.g., V0 and V1), and signals $SEL_3$ and $SEL*_3$ can be provided with different voltages (e.g., V0 and V1).

FIG. 2C shows a chart illustrating relationships between voltages provided to signals $SEL_1$, $SEL_2$, and $SEL_3$ and voltages provided to signals $SEL*_1$, $SEL*_2$, and $SEL*_3$ of FIG. 2A and FIG. 2B, according to some embodiments described herein. Based on chart 245 in FIG. 2B and the relationships between signals $SEL_1$, $SEL_2$, and $SEL_3$ and $SEL*_1$, $SEL*_2$, and $SEL*_3$ in FIG. 2C, memory device 200 can determine which voltage (e.g., either V0 or V1) to provide to each of signals $SEL_1$, $SEL_2$, and $SEL_3$ and $SEL*_1$, $SEL*_2$, and $SEL*_3$, so that all pass transistors (e.g., $240_A$, $240_B$, and $240_C$) of only the selected block among block 0 through block 7 are turned on.

FIG. 3A is a chart 301 showing an example of different unique combinations of voltages V0 and V1 provided to signals $SEL_A$, $SEL_B$, and $SEL_C$ if block 0 is selected (i.e., blocks 1 through block 7 are unselected) during an example memory operation of memory device 200 of FIG. 2A, according to some embodiments described herein. In this example, since block 0 is selected, memory device 200 can cause all transistors $240_A$, $240_B$, and $240_C$ (FIG. 2A) of block 0 to turn on. Thus, each of signals $SEL_A$, $SEL_B$, and $SEL_C$ in FIG. 2A (provided to transistor gate lines $250_A$, $250_B$, and $250_C$ that control transistors $240_A$, $240_B$, and $240_C$, respectively) can be provided with voltage V1 to turn on all of transistors $240_A$, $240_B$, and $240_C$ in order to form a conductive path between a local select line (e.g., $280_0$) and a global select line (e.g., $280'_0$) in block 0. Therefore, in this example, memory device 200 can cause switch SW1 (FIG. 2A) to couple its output node (e.g., a node that provides signal $SEL_1$) to the node that has voltage V1 in order to provide voltage V1 to signal $SEL_1$. This in turn provides voltage V1 to signal $SEL_A$ because transistor gate line $250_A$ is coupled to one of conductive lines 201 that provides signal $SEL_1$ (as shown in FIG. 2A). Similarly, in this example, memory device 200 can cause each of switches SW2 and SW3 to couple their respective output nodes (e.g., nodes that provide signals $SEL_2$ and $SEL_3$) to the node that has voltage V1 in order to provide voltage V1 to each of signals $SEL_2$ and $SEL_3$. This in turn provides voltage V1 to each of signals $SEL_B$ and $SEL_C$ because transistor gate lines $250_B$ and $250_C$ are coupled to respective conductive lines (among conductive lines 201) that provide signal $SEL_2$ and $SEL_3$ (as shown in FIG. 2A).

FIG. 3A shows that each of signals $SEL_A$, $SEL_B$, and $SEL_C$ of block 0 (the selected block in the above example) is provided with voltage V1 in order to turn on all of the transistors (e.g., pass transistors) $240_A$, $240_B$, and $240_C$ of block 0, as described above. In the above example where block 0 is selected, block 1 through block 7 are unselected. Thus, at least one pass transistors in each of block 1 through block 7 can be turned off in order not to form a conductive path between a local select line and a global select line of the unselected block. In the example where block 0 is selected, at least one of transistors $241_A$, $241_B$, and $241_C$ of block 1 in FIG. 2A can be turned off, and at least one of transistors $247_A$, $247_B$, and $247_C$ of block 7 in FIG. 2A can be turned off. FIG. 3A shows that at least one of signals $SEL_A$, $SEL_B$, and $SEL_C$ of each of block 1 through block 7 is provided with voltage V0. This means that at least one pass transistor (i.e., the transistor provided with voltage V0) in each of block 1 through block 7 can be turned off. As shown in FIG. 3A, up to two of signals $SEL_A$, $SEL_B$, and $SEL_C$ may be provided with voltage V0 in an unselected block. Thus, up to two of the pass transistors (e.g., two of transistors $240_A$, $240_B$, and $240_C$) in an unselected block may be turned on (i.e., the transistors provided with voltage V1). However, since at least one of the pass transistors in an unselected block is turned off, no conductive path may be formed through the pass transistors (e.g., through transistors $240_A$, $240_B$, and $240_C$) because at least one of the pass transistors is turned off.

Thus, in the above example where block 0 is selected, memory device 200 can cause at least one of switches SW4, SW5, and SW6 to couple their respective output nodes (e.g., nodes that provide signals $SEL*_1$, $SEL*_2$, and $SEL*_3$) to the node that has voltage V0 in order to provide voltage V0 to at least one of signals $SEL*_1$, $SEL*_2$, and $SEL*_3$. Therefore, at least one of signals $SEL_A$, $SEL_B$, and $SEL_C$ of block 1 through block 7 can also be provided with voltage V0. This allows at least one of the pass transistors of block 1 through 7 to turn off. As shown in FIG. 3A, at least one of signals $SEL_A$, $SEL_B$, and $SEL_C$ of blocks block 1 through block 7 is provided with voltage V0.

FIG. 3B is a chart 302 showing an example of different unique combinations of voltages V0 and V1 provided to signals $SEL_A$, $SEL_B$, and $SEL_C$ if block 1 is selected (i.e., block 0 and block 2 through block 7 are unselected) during another example memory operation of memory device 200 of FIG. 2A, according to some embodiments described herein. Similar to the example associated with FIG. 3A, each of signals $SEL_A$, $SEL_B$, and $SEL_C$ of block 1 (selected block) is provided with voltage V1 while at least one of signals $SEL_A$, $SEL_B$, and $SEL_C$ of block 0 and block 2 through block 7 is provided with voltage V0. Thus, in this example, all of transistors $241_A$, $241_B$, and $241_C$ of block 1 are turned on while at least one of the pass transistors of each of block 0 and block 2 through block 7 (unselected blocks) is turned off.

FIG. 3C is a chart 303 showing an example of different unique combinations of voltages V0 and V1 provided to signals $SEL_A$, $SEL_B$, and $SEL_C$ if block 4 is selected (i.e., block 1, block 2, and block 3 through block 7 are unselected) during another example memory operation of memory device 200 of FIG. 2A, according to some embodiments described herein. As shown in FIG. 3C, each of signals $SEL_A$, $SEL_B$, and $SEL_C$ of block 4 (selected block) is provided with voltage V1 while at least one of signals $SEL_A$, $SEL_B$, and $SEL_C$ of block 1, block 2, and block 3 through block 7 is provided with voltage V0. Thus, in this example, all of the pass transistors of block 4 are turned on while at least one of the pass transistors of each of block 1, block 2, and block 3 through block 7 (unselected blocks) is turned off.

FIG. 2A through FIG. 3C describe an example of memory device 200 having a certain number of components (e.g., blocks, pass transistors, transistor gate lines, and switches). However, the number of such components can vary.

Figure 4A:
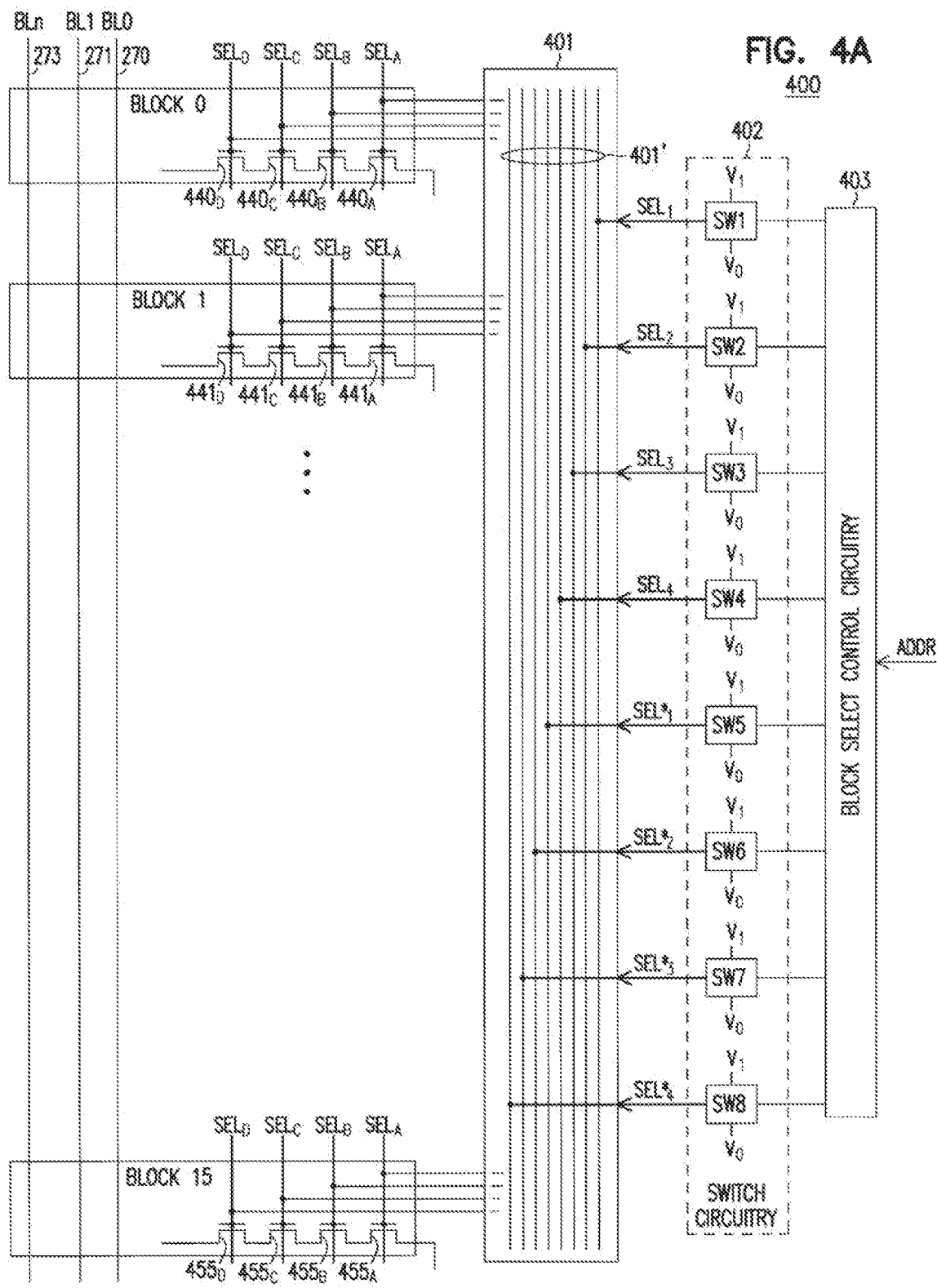
FIG. 4A shows a block diagram of a portion of another memory device including a different number of blocks in comparison with the number of blocks of the memory device of FIG. 2A, according to some embodiments described herein.

FIG. 4A shows a block diagram of a portion of a memory device 400 including blocks (memory cell blocks) 0 through 15 and associated transistors (e.g., pass transistors $440_A$, $440_B$, $440_C$, $440_D$, $441_A$, $441_B$, $441_C$, and $441_D$, and $455_A$, $455_B$, $455_C$, and $455_D$), according to some embodiments described herein. Memory device 400 can include data lines 270, 271, and 272 to carry respective signals BL0, BL1, and BLn, and routing circuitry 401, switch circuitry 402, and block select control circuitry 403. Memory device 400 can include similar or identical elements as those shown in FIG. 2A. Thus, similar or the same components between memory devices 200 and 400 are not repeated.

Differences between memory devices 200 and 400 include a difference in the numbers of blocks, pass transistors, transistor gate lines and associated signals (e.g., block select signals) $SEL_A$, $SEL_B$, $SEL_C$, and $SEL_D$, and switches SW1 through SW8. For example, memory device 400 can include 16 blocks (block 0 through block 15), four pass transistors (e.g., $440_A$, $440_B$, $440_C$, and $440_D$; or $441_A$, $441_B$, $441_C$, and $441_D$; or $455_A$, $455_B$, $455_C$, and $455_D$), in each block; four transistor gate lines and four associated signals $SEL_A$, $SEL_B$, $SEL_C$, and $SEL_D$ in each block; eight switches SW1 through SW8 and eight associated signals $SEL_1$, $SEL_2$, $SEL_3$, and $SEL_4$, and $SEL^*_1$, $SEL^*_2$, $SEL^*_3$, and $SEL^*_4$. For simplicity, details of connections between transistor gate lines of blocks 0 through 15 and conductive lines 401' of routing circuitry 401 are omitted from FIG. 4A. However, such connections can be based on the chart shown in FIG. 4B.

FIG. 4B is a chart (e.g., table) 445 showing unique combinations of signals based on a mapping of $SEL_A$, $SEL_B$, $SEL_C$, and $SEL_D$ of each of block 0 through block 15 and signals $SEL_1$, $SEL_2$, $SEL_3$, $SEL_4$, $SEL^*_1$, $SEL^*_2$, $SEL^*_3$, and $SEL^*_4$ of FIG. 4A, according to some embodiments described herein. FIG. 4B shows an example of 16 unique combinations of eight different signals $SEL_1$, $SEL_2$, $SEL_3$, $SEL_4$, $SEL^*_1$, $SEL^*_2$, $SEL^*_3$, and $SEL^*_4$. Signals $SEL_A$, $SEL_B$, $SEL_C$, and $SEL_D$ of each of block 0 through block 15 can be mapped to a unique combination of signals $SEL_1$, $SEL_2$, $SEL_3$, $SEL_4$, $SEL^*_1$, $SEL^*_2$, $SEL^*_3$, and $SEL^*_4$. This allows all of the pass transistors of only the selected block among block 0 through block 15 to turn on during a memory operation of memory device 400.

FIG. 4C shows charts illustrating relationships between voltages provided to signals $SEL_1$, $SEL_2$, $SEL_3$, and $SEL_4$ and voltages provided to signals $SEL^*_1$, $SEL^*_2$, $SEL^*_3$, and $SEL^*_4$ of FIG. 4A and FIG. 4B, according to some embodiments described herein. Based on chart 445 in FIG. 4B and the relationships between signals $SEL_1$, $SEL_2$, $SEL_3$, and $SEL_4$ and signals $SEL^*_1$, $SEL^*_2$, $SEL^*_3$, and $SEL^*_4$ in FIG. 4B and FIG. 4C, memory device 400 can determine which voltage (e.g., either V0 or V1) to provide to each of signals $SEL_1$, $SEL_2$, $SEL_3$, $SEL_4$, $SEL^*_1$, $SEL^*_2$, $SEL^*_3$, and $SEL^*_4$, so that all pass transistors (e.g., $240_A$, $240_B$, and $240_C$,) of only the selected block (e.g., block 0) among block 0 through block 15 are turned on while at least one of the pass transistors of each of the unselected blocks (e.g., block 1 through block 15) is turned off.

FIG. 5 is a chart showing relationships between the numbers (quantities) of blocks, transistor gate lines in each block, and switches in a memory device (e.g., memory devices 200 and 400), according to some embodiments described herein. Row 502 in FIG. 5 shows the relationships between the number of components of memory device 200 (FIG. 2A through FIG. 3C). Row 504 in FIG. 5 shows the relationships between the number of components of memory device 400 (FIG. 4A through FIG. 4C). Row 506 of FIG. 5 shows the formulas for relationships between the numbers of blocks, transistor gate lines, and switches of a memory device similar to memory devices 200 and 400.

As shown in row 502, the number of blocks is $8=2^3$, the number of transistor gate lines is 3, and the number of switches to provide signals (e.g., $SEL_A$, $SEL_B$, and $SEL_C$) to the blocks is 6=2*3. Thus, the number of switches is less than the number of blocks (6<8). In row 504, the number of blocks is $16=2^4$, the number of transistor gate lines in each block is 4, and the number of switches is 8=2*4. Thus, the number of switches is less than the number of blocks (16<8). In row 506, the number blocks is $B=2^T$ (where T is the number of transistor gate lines in each block) and the number of switches is S=2*T. Since the number of signals (e.g., three of six signals $SEL_1$, $SEL_2$, $SEL_3$, $SEL^*_1$, $SEL^*_2$, and $SEL^*_3$ in FIG. 2B) received by each block is equal to the number of transistor gate lines (e.g., three transistor gate lines $250_A$, $250_B$, and $250_C$ in FIG. 2A), and since S=2*T, the number of switches (5) can also be equal to two times the number of signals received by each block. For example, if X is the number of signals received by each block, then S=2*X.

In general, the memory device (e.g., memory device 200 or 400) described herein can include S switches, where S is an integer. For example, S can be six in the example of FIG. 2A where memory device 200 includes six switches SW1 through SW6. In another example, S can be eight in the example of FIG. 4A where memory device 400 includes eight switches SW1 through SW8.

The S switches can provide N signals, where N is an integer. For example, N can be six in the example of FIG. 2A where six switches SW1 through SW6 provide six signals $SEL_1$, $SEL_2$, $SEL_3$, $SEL^*_1$, $SEL^*_2$, and $SEL^*_3$, respectively. In another example, N can be eight in the example of FIG. 4A where eight switches SW1 through SW8 provide eight signals $SEL_1$, $SEL_2$, $SEL_3$, $SEL_4$, $SEL^*_1$, $SEL^*_2$, $SEL^*_3$, and $SEL^*_4$, respectively.

The N signals can be provided to B blocks of the memory device (e.g., memory device 200 or 400) where B is an integer. For example, B can be eight in the example of FIG. 2A where memory device 200 includes eight blocks (e.g., block 0 through block 7). In another example, B can be 16 in the example of FIG. 4A where memory device 400 includes 16 blocks (e.g., block 0 through block 15).

As described above with reference to FIG. 2B and FIG. 4B, the memory device (e.g., memory device 200 or 400) described herein can provide C unique combinations of the N signals. For example, C can be eight (eight unique combinations of the N signals) in the example of FIG. 2A. In another example, C can be 16 (16 unique combinations of the N signals) in the example of FIG. 4A.

As also described above with reference to FIG. 2B and FIG. 4A, each of the C unique combinations of the N signals can include X signals, where X is an integer. For example, X can be three (e.g., three of six signals $SEL_1$, $SEL_2$, $SEL_3$, $SEL^*_1$, $SEL^*_2$, and $SEL^*_3$) in the example of FIG. 2A (where C=8). In another example, X can be four (e.g., four of eight signals $SEL_1$, $SEL_2$, $SEL_3$, $SEL_4$, $SEL^*_1$, $SEL^*_2$, $SEL^*_3$, and $SEL^*_4$) in the example of FIG. 4A (where C=16).

Figure 6A:
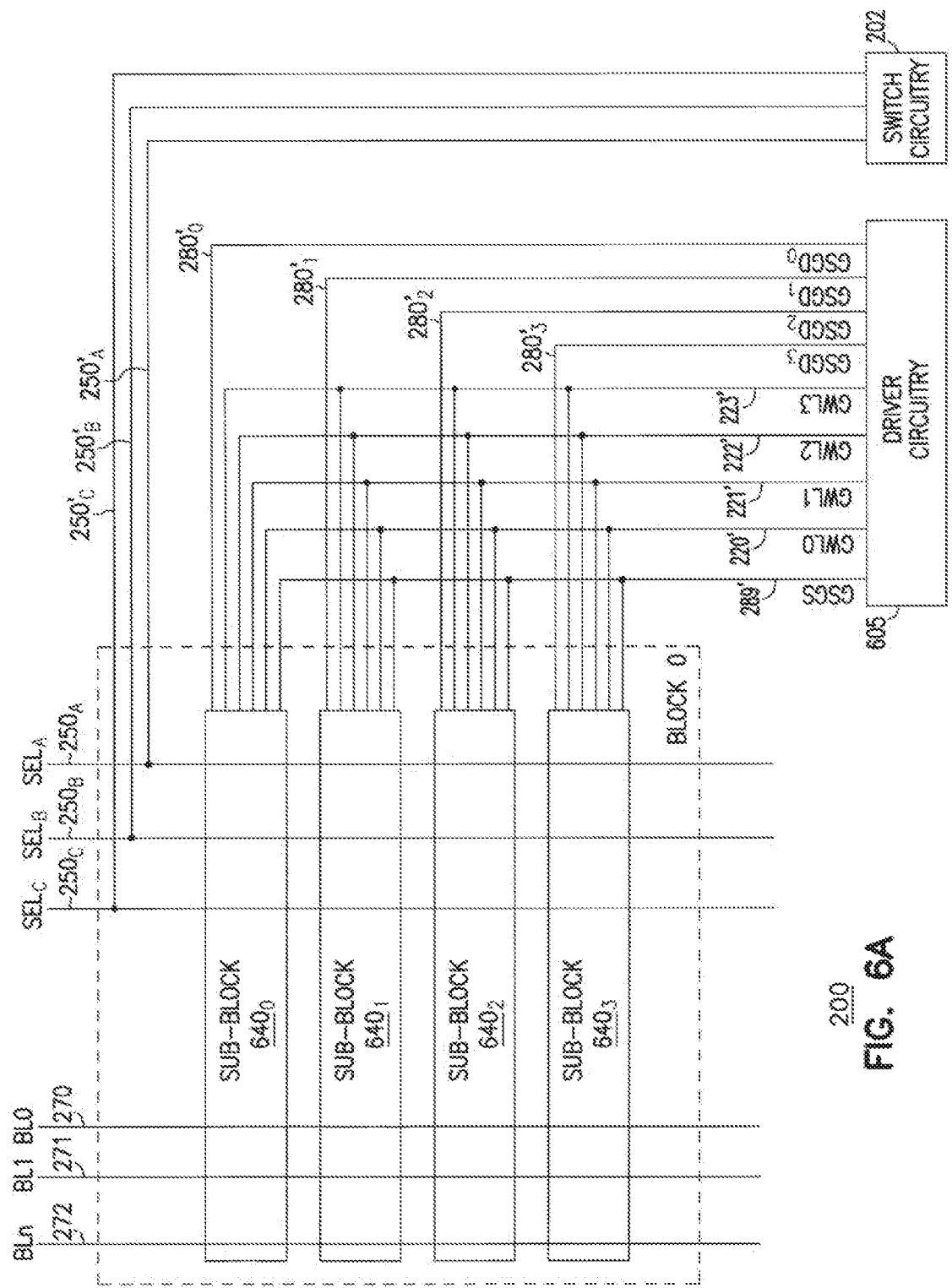
FIG. 6A shows a block diagram of the memory device of FIG. 2A including sub-blocks of a block of the memory device, according to some embodiments described herein.

FIG. 6A shows a block diagram of memory device 200 of FIG. 2A including sub-blocks $640_0$, $640_1$, $640_2$, and $640_3$ of block 0, according to some embodiments described herein. FIG. 6A shows block 0 including four sub-blocks $640_0$, $640_1$, $640_2$, and $640_3$ as an example. The number of sub-blocks of block 0 can vary.

As shown in FIG. 6A, sub-blocks $640_0$, $640_1$, $640_2$, and $640_3$ can share data lines 270, 271, and 272. Transistor gate lines $250_A$, $250_B$, and $250_C$, conductive connections $250'_A$, $250'_B$, and $250'_C$, global select line $280'_0$, and switch circuitry 202 are the same as those described above with reference to FIG. 2A. For simplicity, description of the same components of memory device 200 shown in FIG. 2A and FIG. 6A are not repeated. In FIG. 6A, sub-blocks $640_0$, $640_1$, $640_2$, and $640_3$ can exchange information with data lines 270, 271, 272 one sub-block at a time if block 0 is a selected block during a memory operation of memory device 200. Sub-blocks $640_0$, $640_1$, $640_2$, and $640_3$ have separate select lines (e.g., global drain select lines) $280'_0$, $280'_1$, $280'_2$, and $280'_3$. Select lines $280'_0$, $280'_1$, $280'_2$, and $280'_3$ are electrically uncoupled to each other. Sub-blocks $640_0$, $640_1$, $640_2$, and $640_3$ can share a select line (e.g., global source select lines) $289'$ and share access lines (e.g., global access lines) $220'$, $221'$, $222'$, and $223'$.

Memory device 200 can include driver circuitry 605 to provide signals $GSGD_0$, $GSGD_1$, $GSGD_2$, and $GSGD_3$ on respective select lines $280'_0$, $280'_1$, $280'_2$, and $280'_3$, a signal GSGS on select line $289'$, and signals GWL0, GWL1, GWL2, and GWL3 on respective access lines $220'$, $221'$, $222'$, and $223'$. Driver circuitry 605 can activate (e.g., provide a positive voltage to) one of signals $GSGD_0$, $GSGD_1$, $GSGD_2$, and $GSGD_3$ associated with a sub-block that is selected and deactivate (e.g., provide zero volts to) the sub-blocks that are not selected. For example, if sub-block $640_0$ is selected (to store information in or read information from memory cells (shown in FIG. 6B) of sub-block $640_0$), then driver circuitry 605 can activate signal $GSGD_0$ while deactivating signals $GSGD_1$, $GSGD_2$, and $GSGD_3$.

In this description, a selected sub-block of a selected block is a sub-block that is selected by memory device 200 to store information in (e.g., in a write operation) or read (e.g., sense) information from (e.g., in a read operation) a memory cell (or memory cells) of that selected sub-block. An unselected sub-block of a selected block is sub-block that is not selected by memory device 200 during a memory operation.

FIG. 6B shows schematic diagrams of sub-block $640_0$ of block 0 of memory device 200 of FIG. 6A, according to some embodiments described herein. As shown in FIG. 6B, memory device 200 can include memory cells 210, 211, 212, and 213. Memory cells 210, 211, 212, and 213 can correspond to memory cells 110 of FIG. 1. Thus, memory cells 210, 211, 212, and 213 can include non-volatile memory cells (e.g., floating gate memory cells, charge trap memory cells, or other types of non-volatile memory cells).

As shown in FIG. 6B, memory cells 210, 211, 212, and 213 can be arranged in memory cell strings $230_0$, $231_0$, and $232_0$. Each of the memory cell strings $230_0$, $231_0$, and $232_0$ can include one of memory cells 210, one of memory cells 211, one of memory cells 212, and one of memory cells 213. FIG. 6B shows an example where memory device 200 has four levels (e.g., four tiers) of respective memory cells 210, 211, 212, and 213 and four memory cells in each of the memory cell strings. The number of levels (e.g., tiers) of memory cells, and the number of memory cells in each memory cell string, can vary.

Memory device 200 can include select gates (e.g., drain select gates) $260_0$, a select line (e.g., local drain select line) $280_0$ and associated signal $SGD_0$, select gates (e.g., source select gate) $260'_0$, a select line (e.g., local source select line) 289 and associated signal SGS, and a source (e.g., source line) 299 that can carry a signal SRC. In memory device 200, a select line (e.g., select line $280_0$ or 289) can include a conductive material to carry a signal (e.g., signal $SGD_0$ or SGS), but a select line does not operate like a transistor. A select gate (e.g., one of select gates $260_0$ or one of select gates $260'_0$) can receive a signal from a respective select line and can operate like a transistor (e.g., a FET).

As shown in FIG. 6B, memory device 200 can include control lines (e.g., local access lines) 220, 221, 222, and 223 that can carry corresponding signals (e.g., word line signals) WL0, WL1, WL2, and WL3. FIG. 2A shows four control lines (e.g., 220, 221, 222, and 223) as an example. The number of control lines of memory device 200 can vary.

In this description, a line (e.g., any of local drain select lines $280_0$, $280_1$, $280_2$, $280_3$, $281_0$, and $287_0$; any of global drain select lines $280'_0$, $280'_1$, $280'_2$, $280'_3$, $281'_0$, and $287'_0$; source select line 289; any of transistor gate lines $250_A$, $250_B$, $250_C$, $251_A$, $251_B$, $251_C$, $257_A$, $257_B$, $257_C$; any of control lines 220, 221, 222, and 223; and any of global access lines $220'$, $221'$, $222'$, and $223'$) includes a piece of conductive material, a region of conductive material, a layer of conductive material, or any shape of a structure that can carry an electrical signal. Thus, in this description, a line (e.g., a select line, a transistor gate line, or a control line) includes a "line" shape structure and any other structural shapes (e.g., a region of any shape, a layer shape, and other shapes).

As shown in FIG. 6B, memory device 200 can include different groups of three transistors $240_A$, $240_B$, and $240_C$ coupled in series with each other and coupled in series between two respective lines. For example, memory device 200 includes a group of transistors $240_A$, $240_B$, and $240_C$ coupled in series with each other and coupled in series between select lines $280_0$ and $280'_0$. In another example, memory device 200 includes a group of transistors $240_A$, $240_B$, and $240_C$ coupled in series with each other and coupled in series between select lines 289 and $280'_0$. Similarly, memory device 200 includes transistors $240_A$, $240_B$, and $240_C$ coupled in series with each other and coupled in series between each of control lines 221, 222, and 223 and a respective access line (e.g., global access line) among access lines $220'$, $221'$, $222'$, and $223'$.

As shown in FIG. 2B, transistors $240_A$ have gates that are electrically uncoupled to the gates of transistors $240_B$. The gates of transistors $240_B$ are also electrically uncoupled to the gates of transistors $240_C$.

The gates of transistors $240_A$ can be coupled to transistor gate line $250_A$. Thus, the same signal (e.g., signal $SEL_A$) provided to transistor gate line $250_A$ can be used to control (e.g., turn on and turn off) transistors $240_A$ at the same time. This means that transistors $240_A$ can be concurrently turned on (e.g., turned on at the same time) or currently turned off (e.g., turned off at the same time).

Similarly, gates of transistors $240_B$ can be coupled to transistor gate line $250_B$. Thus, the same signal (e.g., signal $SEL_B$) provided to transistor gate line $250_B$ can be used to control (e.g., turn on and turn off) transistors $240_B$ at the same time. This means that transistors $240_B$ can be concurrently turned on (e.g., turned on at the same time) or currently turned off (e.g., turned off at the same time). The gates of transistors $240_C$ can be coupled to transistor gate line $250_C$. Thus, the same signal (e.g., signal $SEL_C$) provided to transistor gate line $250_C$ can be used to control (e.g., turn on and turn off) transistors $240_C$ at the same time. This means that transistors $240_C$ can be concurrently turned on (e.g., turned on at the same time) or currently turned off (e.g., turned off at the same time). As described above with reference to FIG. 2A, signals $SEL_A$, $SEL_B$, and $SEL_C$ can be provided from switches SW1 through SW6 by a unique combination of signals $SEL_1$, $SEL_2$, $SEL_3$, $SEL^*_1$, $SEL^*_2$, and $SEL^*_3$ at output nodes of switches SW1 through SW6 (FIG. 2A).

During a memory operation, memory device 200 can use control lines 220, 221, 222, and 223 to access memory cells of memory cell strings $230_0$, $231_0$, and $232_0$. For example, if block 0 (which includes sub-block $640_0$ of FIG. 6B) is a selected block during a memory operation (e.g., read or write) of memory device 200, all of transistors $240_A$, $240_B$, and $240_C$ can be turned on. Control lines 220, 221, 222, and 223 can be activated (e.g., provided with positive voltages) to access a selected memory cell (or selected memory cells) of a selected memory cell string (or strings) among memory cell strings $230_0$, $231_0$, and $232_0$. In this example, information can be stored in a memory cell (or memory cells) of the selected memory cell string (or memory cell strings) if the memory operation is a write (e.g., program) operation. In this example, information can be read (e.g., sensed) from a memory cell (or memory cells) of the selected memory cell string (or memory cell strings) of selected block 0 if the memory operation is a read operation. In another example, if block 0 is an unselected block during a memory operation of memory device 200, one of the following sets of transistors can be turned off: transistors $240_A$; transistors $240_B$; transistors $240_C$; transistors $240_A$ and transistors $240_B$; transistors $240_A$ and transistors $240_C$; transistors $240_B$ and transistors $240_C$; or all of transistors $240_A$, transistors $240_B$, and transistors $240_C$. Control lines 220, 221, 222, and 223 can be deactivated (e.g., provided with zero volts (e.g., ground potential)). Thus, in this example (block 0 is unselected), no information is stored in or read from the memory cells of memory cell strings $230_0$, $231_0$, and $232_0$ of block 0.

During a memory operation of memory device 200, if block 0 is a selected block and sub-block $640_0$ is a selected sub-block, one or both select gates can be activated (e.g., by turning on the select gates), depending on which memory operation (e.g., a read or write) memory device 200 performs on the selected sub-block. Activating select gates $260_0$ during a memory operation of memory device 200 can include providing (e.g., applying) a voltage having a positive value to signal $GSGD_0$ on select line $280'_0$ and turning on all of transistors $240_A$, $240_B$, and $240_C$ coupled to select lines $280_0$ and $280'_0$. This allows the voltage (e.g., a positive voltage) from select line (e.g., global drain select line) $280'_0$ to be passed from select line $280'_0$ to select line (e.g., local drain select line) $280_0$ through transistors $240_A$, $240_B$, and $240_C$ (that are turned on). The positive voltage provided to select line $280_0$ can activate (e.g., turn on) select gates $260_0$. This forms conductive paths (e.g., current paths) between memory cell strings $230_0$, $231_0$, and $232_0$ and data lines 270, 271, and 272, respectively.

Similarly, activating select gates $260'_0$ during a memory operation of memory device 200 can include providing (e.g., applying) a voltage having a positive value to signal GSGS and turning on all of transistors $240_A$, $240_B$, and $240_C$ coupled to select line 289. This allows the voltage (e.g., a positive voltage) from select line (e.g., global source select line) 289' to be passed from select line 289' to select line (e.g., local source select line) 289 through transistors $240_A$, $240_B$, and $240_C$ (that are turned on). The positive voltage provided to select line 289 can activate (e.g., turn on) select gates $260'_0$. This forms conductive paths (e.g., current paths) between memory cell strings $230_0$, $231_0$, and $232_0$ and source 299. During a write operation of memory device 200, if sub-block $640_0$ is a selected sub-block, memory device 200 can concurrently select memory cells of different memory cell strings (e.g., memory cells coupled to the same control line) of sub-block $640_0$ in order to store information in the selected memory cells. During a read operation of memory device 200, if sub-block $640_0$ is a selected sub-block, memory device 200 can concurrently select memory cells of different memory cell strings (e.g., memory cells coupled to the same control line) of sub-block $640_0$ in order to read information in the selected memory cells.

Figure 6C:
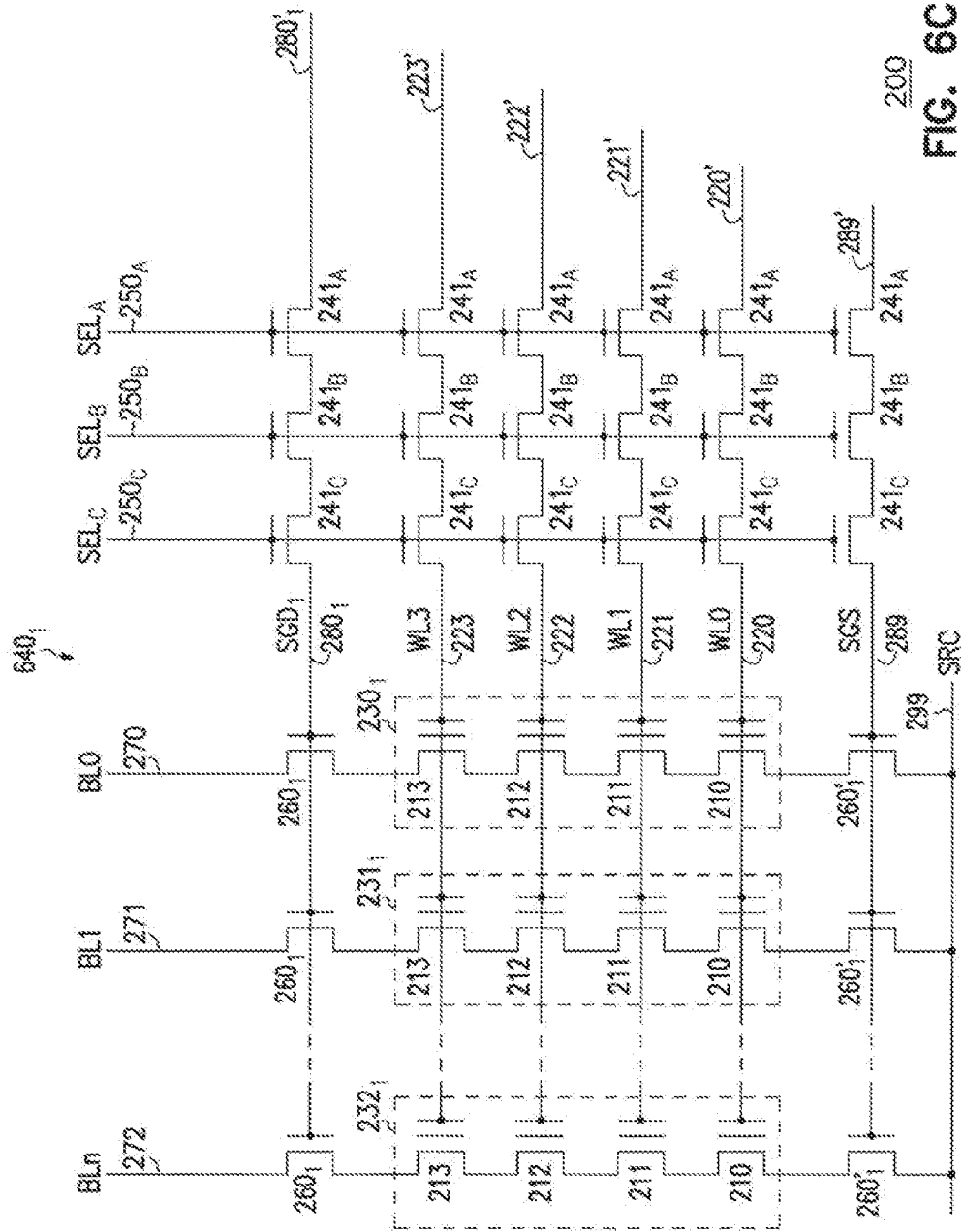
Figure 6D:
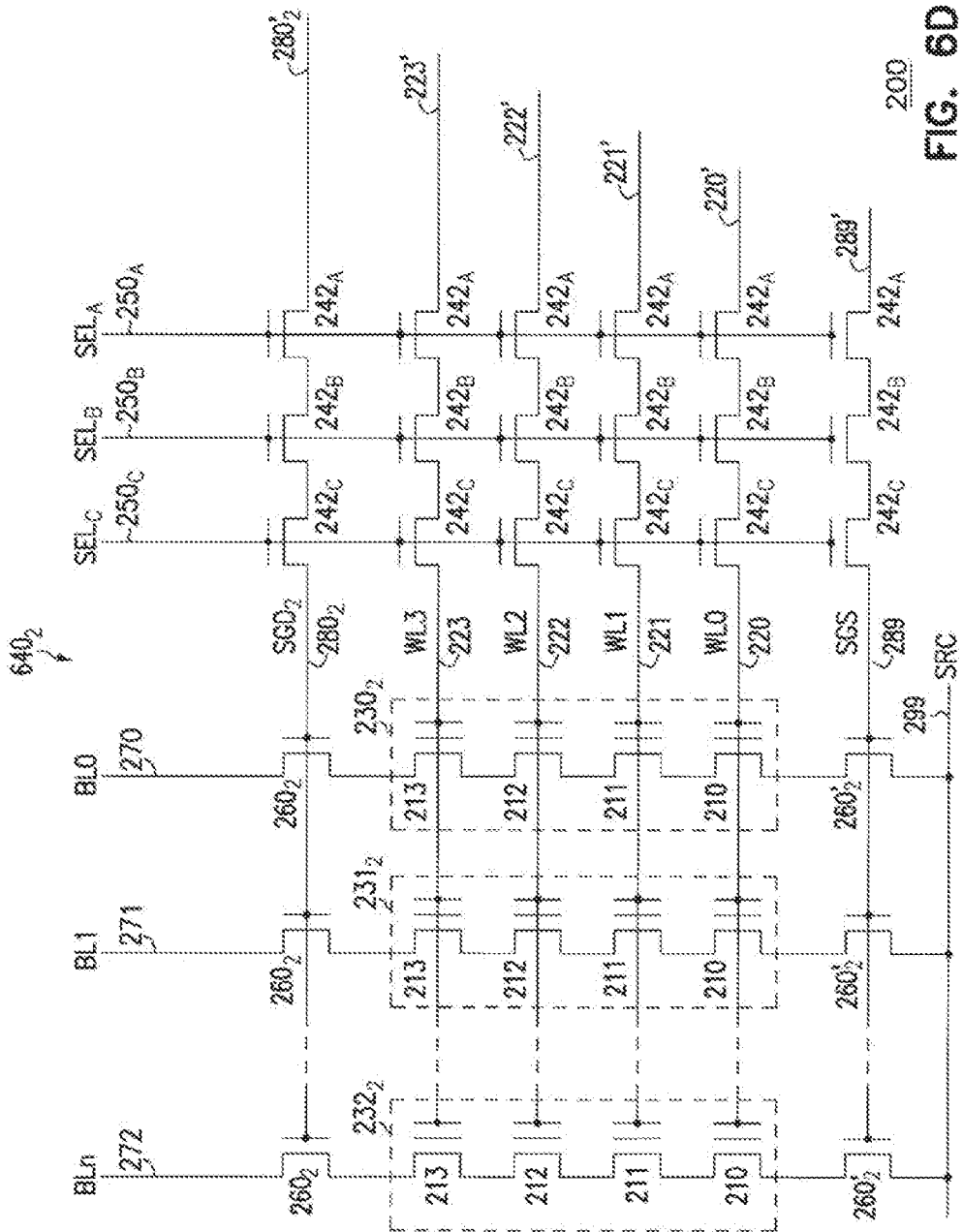
Figure 6E:
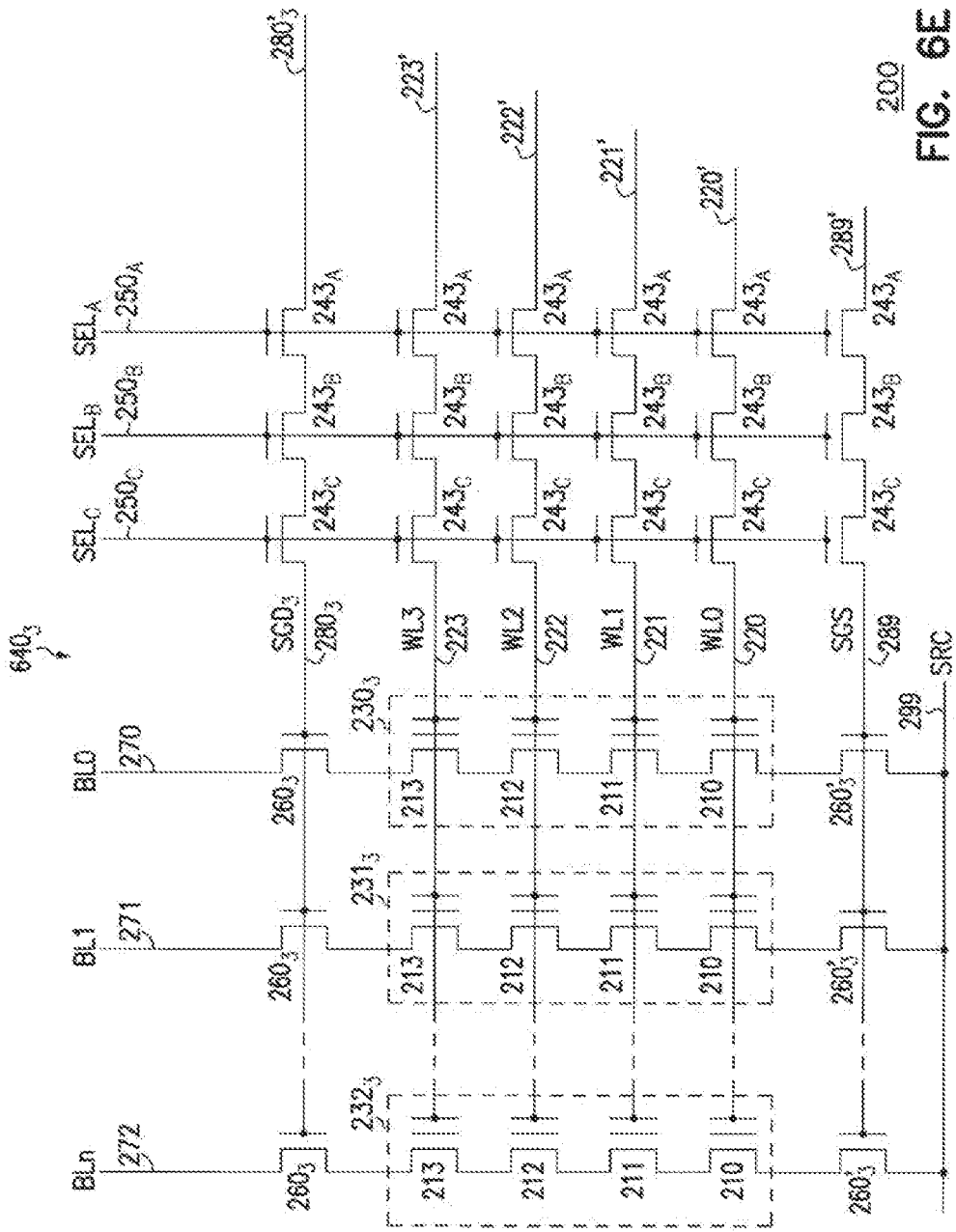

FIG. 6C, FIG. 6D, and FIG. 6E show schematic diagrams of sub-blocks $640_1$, $640_2$, and $640_3$, respectively, of block 0 of memory device 200 of FIG. 6A, according to some embodiments described herein. Sub-blocks $640_1$, $640_2$, and $640_3$ include elements that are similar to or the same as the elements of sub-block $640_0$ of FIG. 6B. Some of the elements of sub-blocks $640_0$ are shared with sub-blocks $640_1$, $640_2$, and $640_3$. Thus, for simplicity, descriptions of similar or the same elements or shared elements among sub-block $640_0$ (FIG. 6B) and sub-blocks $640_1$, $640_2$, and $640_3$ are not repeated.

As shown in FIG. 6C, sub-block $640_1$ can include control lines 220, 221, 222, and 223 (and associated signals WL0, WL1, WL2, and WL3), select line 289 (and associated signal SGS), and source 299 (and associated signal SRC). Sub-block $640_1$ of memory device 200 can include memory cells 210, 211, 212, and 213 arranged in memory cell strings $230_1$, $231_1$, and $232_1$, which are different from memory cell strings $230_0$, $231_0$, and $232_0$ of sub-block $640_0$ of FIG. 6B. Sub-block $640_1$ of FIG. 6C can include select gates (e.g., drain select gates) $260_1$, a select line (e.g., local drain select line) $280_1$ and associated signal $SGD_1$, and select gates (e.g., source select gate) $260'_1$.

As shown in FIG. 6D, sub-block $640_2$ can include control lines 220, 221, 222, and 223 (and associated signals WL0, WL1, WL2, and WL3), select line 289 (and associated signal SGS), and source 299 (and associated signal SRC). Sub-block $640_2$ of memory device 200 can include memory cells 210, 211, 212, and 213 arranged in memory cell strings $230_2$, $231_2$, and $232_2$, which are different from memory cell strings $230_1$, $231_1$, and $232_1$ of sub-block $640_1$ of FIG. 6C. Sub-block $640_3$ of FIG. 6D can include select gates (e.g., drain select gates) $260_2$, a select line (e.g., local drain select line) $280_2$ and associated signal $SGD_2$, and select gates (e.g., source select gate) $260'_2$.

As shown in FIG. 6E, sub-block $640_3$ can include control lines 220, 221, 222, and 223 (and associated signals WL0, WL1, WL2, and WL3), select line 289 (and associated signal SGS), and source 299 (and associated signal SRC). Sub-block $640_3$ of memory device 200 can include memory cells 210, 211, 212, and 213 arranged in memory cell strings $230_3$, $231_3$, and $232_3$, which are different from memory cell strings $230_2$, $231_2$, and $232_2$ of sub-block $640_2$ of FIG. 6D. Sub-block $640_3$ of FIG. 6E can include select gates (e.g., drain select gates) $260_3$, a select line (e.g., local drain select line) $280_3$ and associated signal $SGD_3$, and select gates (e.g., source select gate) $260'_3$.

Memory device 200 of FIG. 2A described above with reference to FIG. 2A through FIG. 6E may include only one pass transistor or two pass transistors (instead of three pass transistors $240_A$, $240_B$, and $240_C$) in each of block 0 through block 7. However, in comparison with some conventional memory devices, the inclusion of three (or more) pass transistors in each of block 0 through block 7 can allow the memory device described herein (e.g., memory device 200 or 400) to have fewer switches (e.g., fewer switches in switch circuitry 202 of FIG. 2A or in switch circuitry 402 of FIG. 4A) to select a relatively higher number of blocks. For example, some conventional memory devices may have techniques to select a given number of blocks in which the number of switches may have a one-to-one relationship with the number of blocks. As an example, to select one of eight blocks in some conventional memory devices, eight (or more) switches may be needed in order to provide signals (e.g., eight or more signals) to select the blocks in such conventional memory devices. In another example, to select one of 16 blocks in some conventional memory devices, 16 (or more) switches may be needed in order to provide signals (e.g., 16 or more signals) to select the blocks in such conventional memory devices.

In memory device 200, by including multiple pass transistors (e.g., three pass transistors), the number of switches used to provide signals to the blocks can be less than the number of the blocks. Improvements of memory device 200 (and memory device 400) over conventional memory devices are similar to those mentioned above in the description of FIG. 1. Such improvements include a lower number of sub-blocks, a lower number of pages per block, a higher number of blocks for a given device area (e.g., pitch area), a lower energy consumption, and shorter time for some memory operations of memory device 100.

Figure 7A:
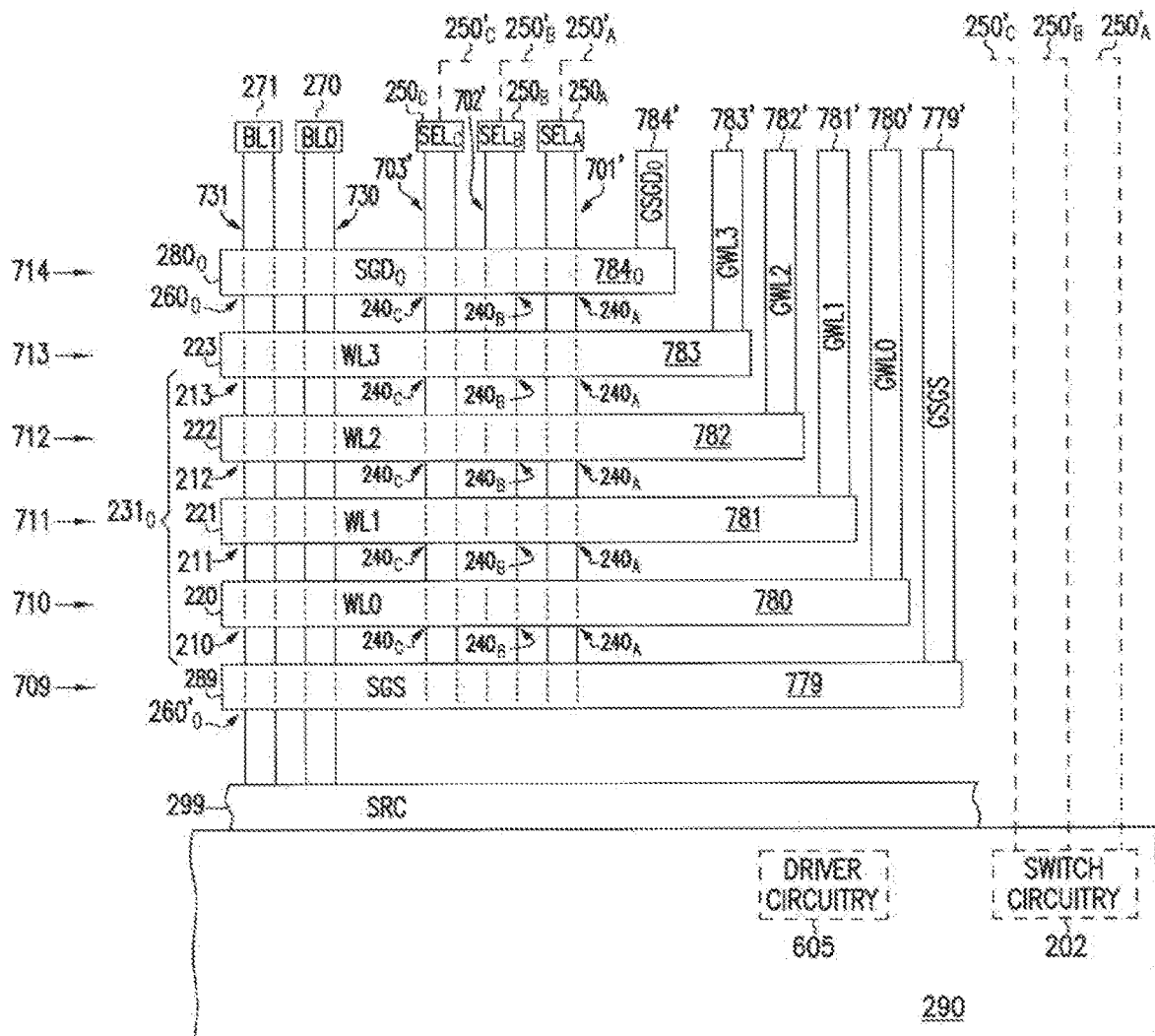
FIG. 7A shows a side view (in the x-z directions) of a structure of a portion of the memory device of FIG. 2A and FIG. 6A through FIG. 6E, according to some embodiments described herein.

FIG. 7A shows a side view (in the x-z directions) of a structure of a portion of memory device 200, according to some embodiments described herein. The structure of memory device 200 can be used as an example structure of memory device 200 described above with reference to FIG. 2A through FIG. 6E. The side view of the portion of memory device 200 in FIG. 7A is taken along line 7A-7A of FIG. 7B (described below after the description of FIG. 7A). For simplicity, similar or identical elements of memory device 200 shown in FIG. 2A through FIG. 6E, and FIG. 7A and FIG. 7B are given the same labels. Some of the functions of similar and identical elements of memory device 200 shown in FIG. 2A through FIG. 6E, and FIG. 7A and FIG. 7B are not repeated. The side view of the portion of memory device 200 include structures of the components of sub-block $640_0$ (shown in FIG. 6B and FIG. 7B) of block 0. Other sub-blocks $640_1$, $640_2$, and $640_3$ of block 0 include structures of the components similar to those of sub-block $640_0$ shown in FIG. 7A. Thus, for simplicity, the description here omits detailed description of the structures and components of sub-blocks $640_1$, $640_2$, and $640_3$.

As shown in FIG. 7A, memory device 200 can include a substrate 290, which can be a semiconductor substrate. For example, substrate 290 can include n-type or p-type semiconductor material (e.g., n-type or p-type silicon substrate).

Memory device 200 includes different levels (e.g., tiers) 709 through 714 with respect to a z-direction, which extends in a direction of the thickness (in the z-direction) of substrate 290. FIG. 7A also shows an x-direction, which is perpendicular to the z-direction. Levels 709 through 714 are internal physical levels (physical tiers) of memory device 200.

Memory device 200 can include semiconductor materials 779 through $784_0$ located in respective levels 709 through 714. Semiconductor materials 779 through $784_0$ can be layers or materials. Semiconductor materials 779 through $784_0$ can include conductively doped polycrystalline silicon (e.g., polysilicon doped with impurities (e.g., n-type or different types of impurities)) or other conductively doped semiconductor materials. Thus, each of semiconductor materials 779 through $784_0$ can include n-type (or p-type) polycrystalline silicon. Memory device 200 can also include dielectric materials (e.g., silicon dioxide) formed in the z-direction between (e.g., in the spaces between the layers of) semiconductor materials 779 through $784_0$. Such dielectric materials are not shown in FIG. 7A for simplicity. As described below, portions of each of semiconductor materials 779 through $784_0$ in FIG. 7A can form portions of respective components (e.g., select gates, pass transistors, memory cells, and control lines) of memory device 200.

Memory device 200 can include conductive materials 779' through 784' contacting (e.g., electrically coupled to) semiconductor materials 779 through $784_0$, respectively. Conductive materials 779' through 784' can be used to carry signals GSGS, signals GWL0, GWL1, GWL2, and GWL3, and $GSGD_0$, respectively. Each of conductive materials 779' through 784' can be formed vertically with respect to substrate 290, such that each of conductive materials 779' through 784' can have a length in the z-direction. Conductive materials 779' through 784' can be parts of respective global source select line 289', global access lines 220', 221', 222', and 223', and global drain select line $280'_0$ (all of these global lines are also schematically shown in FIG. 6A).

As shown in FIG. 7A, memory cells 210, 211, 212, and 213 of memory cell string $231_0$ can be located in levels 710, 711, 712, and 713, respectively (e.g., arranged vertically in the z-direction with respect to substrate 290). Memory cells 210, 211, 212, and 213 can be structured as floating gate memory cells, charge trap memory cells, or other types of non-volatile memory cells.

Data lines 270, 271, and 272, and transistor gate lines $250_A$, $250_B$, and $250_C$ can include conductive materials that are formed over semiconductor materials 779 through $784_0$ (e.g., formed above level 714 of memory device 200). Source (e.g., source line) 299 of memory device 200 can include a conductive material and have a length extending in the x-direction. Source 299 can be formed under semiconductor materials 779 through $784_0$ (e.g., formed below level 709 of memory device 200). FIG. 7A shows an example where source 299 can be formed over a portion of substrate 290 (e.g., by depositing a conductive material over substrate 290). Alternatively, source 299 can be formed in or formed on a portion of substrate 290 (e.g., by doping a portion of substrate 290).

As shown in FIG. 7A, driver circuitry 605 (which is schematically shown in FIG. 6A) and switch circuitry 202 (which is schematically shown in FIG. 6A) of memory device 200 can be located in (e.g., formed in or formed on) substrate 290 and below the level 709. Thus, driver circuitry 605 and switch circuitry 202 can be formed under semiconductor materials 779 through $784_0$ (e.g., formed under the memory cell strings of memory device 200). Some of the connections (e.g., conductive connections $250'_A$, $250'_B$, and $250'_C$) between switch circuitry 202 and transistor gate lines $250_A$, $250_B$, and $250_C$ are shown in FIG. 7A. For simplicity, connections between driver circuitry 605 and other components of memory device 200 are not shown in FIG. 7A. Substrate 290 can include other circuitry (not shown in FIG. 7A) of memory device 200 such as decoders, sense amplifiers, and page buffer circuits.

As shown in FIG. 7A, memory device 200 can include pillars (e.g., a vertical columns of materials) 730, 731, 701', 702', and 703'. Each of pillars 730, 731, 701', 702', and 703' can have a length extending through semiconductor materials 779 through $784_0$ in the z-direction. During processes of forming memory device 200, semiconductor materials 779 through $784_0$ can be formed (e.g., deposited one after another in the z-direction over substrate 290). Then, holes can be formed (e.g., vertically formed in the z-direction) through semiconductor materials 779 through $784_0$. After the holes are formed, pillars 730, 731, 701', 702', and 703' can be formed (e.g., vertically formed in the z-direction) in the holes. As shown in FIG. 7A, pillars 730 and 731 can contact (e.g., can be electrically coupled to) source 299, whereas pillars 701', 702', and 703' may not be electrically coupled to source 299. Pillars 730 and 731 can operate to serve functions that are different from the functions of pillars 701', 702', and 703'.

Pillar 731 can include a conductive material contacting data line 271 and source 299. Pillar 731 can form part of a body of a respective select gate $260_0$, a body of memory cell string $231_0$, and a body of a respective select gate $260'_0$. During a memory operation of memory device 200, pillar 731 can form a current path (e.g., a conductive channel)

between data line 271 and source 299 (through respective bodies of select gates $260_0$ and $260'_0$ and memory cell string $231_0$).

Similarly, pillar 730 can include a conductive material contacting data line 270 and source 299. Pillar 730 can form part of a body of a respective select gate $260_0$, a body of a respective select gate $260'_0$, and a body of memory cell string $230_0$ (show in FIG. 6B and not labeled in FIG. 7A). During a memory operation of memory device 200, pillar 730 can form a current path (e.g., a conductive channel) between data line 270 and source 299 (through respective bodies of select gates $260_0$ and $260'_0$ and memory cell string $231_0$).

Pillar 701' can include a conductive material contacting transistor gate line $250_A$ and extending along the length of pillar 701' (e.g., the conductive material extends from transistor gate line $250_A$ to level 709). Pillar 701' can operate to form part of a gate (transistor gate) of each of transistors $240_A$.

Pillar 702' can include a conductive material contacting transistor gate line $250_B$ and extending along the length of pillar 702' (e.g., the conductive material extends from transistor gate line $250_B$ to level 709). Pillar 702' can operate to form part of a gate (transistor gate) of each of transistors $240_B$.

Pillar 703' can include a conductive material contacting transistor gate line $250_C$ and extending along the length of pillar 703' (e.g., the conductive material extends from transistor gate line $250_C$ to level 709). Pillar 703' can operate to form part of a gate (transistor gate) of each of transistors $240_C$.

Control lines 220, 221, 222, and 223 can include separate materials (electrically uncoupled to each other) that are arranged in a staircase configuration (as shown in FIG. 7A). Control lines 220, 221, 222, and 223 can be formed from portions of respective semiconductor materials 780, 781, 782, and 783. Thus, control lines 220, 221, 222, and 223 can include conductively doped polycrystalline silicon (polysilicon doped impurities (e.g., n-type or different types of impurities)) or other conductively doped semiconductor materials. As shown in FIG. 7A, control lines 220, 221, 222, and 223 (associated with signals WL0, WL1, WL2, and WL3) and respective memory cells 210, 211, 212, and 213 can be located in levels 710, 711, 712, and 713, respectively, along a portion (e.g., the segment extending from level 710 to level 713) of each of pillars 730 and 731.

Select line (e.g., drain select line) $280_0$ can be formed over control lines 220, 221, 222, and 223. Select line $280_0$ can be formed from a portion of semiconductor material $784_0$. Thus, the material of each of select line $280_0$ can include conductively doped polycrystalline silicon (polysilicon doped impurities (e.g., n-type or different types of impurities)) or other conductively doped semiconductor materials. As shown in FIG. 7A, select line $280_0$ and associated select gates $260_0$ can be located along a portion (e.g., the segment at level 714) of each of pillars 730 and 731. Select line $280_0$ can also be located along a portion (e.g., the segment at level 714) of each of pillars 701', 702', and 703'.

Select line (e.g., source select line) $280'_0$ can be formed under control lines 220, 221, 222, and 223. Select line $280'_0$ can be formed from a portion of semiconductor materials 779. Thus, the material of each of select line $280'_0$ can include conductively doped polycrystalline silicon (polysilicon doped with impurities (e.g., n-type or different types of impurities)) or other conductively doped semiconductor materials. As shown in FIG. 7A, select line $280'_0$ and associated select gates $260'_0$ can be located along a portion (e.g., the segment at level 709) of each of pillars 730 and 731. Select line $280_0$ can also be located along a portion (e.g., the segment at level 709) of each of pillars 701', 702', and 703'.

As shown in FIG. 7A, transistors $240_A$, $240_B$, and $240_C$ can be formed in the same levels (e.g., same tiers) as select gates $260_0$ and $260'_0$ and memory cells 210, 211, 212, and 213 of memory device 200. For example, transistors $240_A$ can be located along a portion (e.g., the segment extending from level 709 to level 714) of pillar 701'. Transistors $240_B$ can be located along a portion (e.g., the segment extending from level 709 to level 714) of pillar 702'. Transistors $240_C$ can be located along a portion (e.g., the segment extending from level 709 to level 714) of pillar 703'.

Portions (e.g., sources and drains) of transistors $240_A$, $240_B$, and $240_C$ in a particular level of memory device 200 can be formed from portions of respective semiconductor materials 779 through $784_0$ on those particular levels. As shown in FIG. 7A, portions (e.g., sources and drains) of transistors $240_A$, $240_B$, and $240_C$ in level 714 can be formed from portions of semiconductor material $784_0$, (which is the same as the semiconductor material $784_0$ that forms portions of select gates $260_0$ and select line $280_0$). Portions (e.g., sources and drains) of transistors $240_A$, $240_B$, and $240_C$ in each of levels 710 through 713 can be formed from portions of respective semiconductor materials 780 through 783 (which are the same as the semiconductor materials 780 through 783 that form respective control lines 220, 221, 222, and 223). Portions (e.g., sources and drains) of transistors $240_A$, $240_B$, and $240_C$ in level 709 can be formed from portions of semiconductor material 779 (which is the same as the semiconductor material 779 that forms portions of select gates $260'_0$ and select line 289.

Figure 7B:
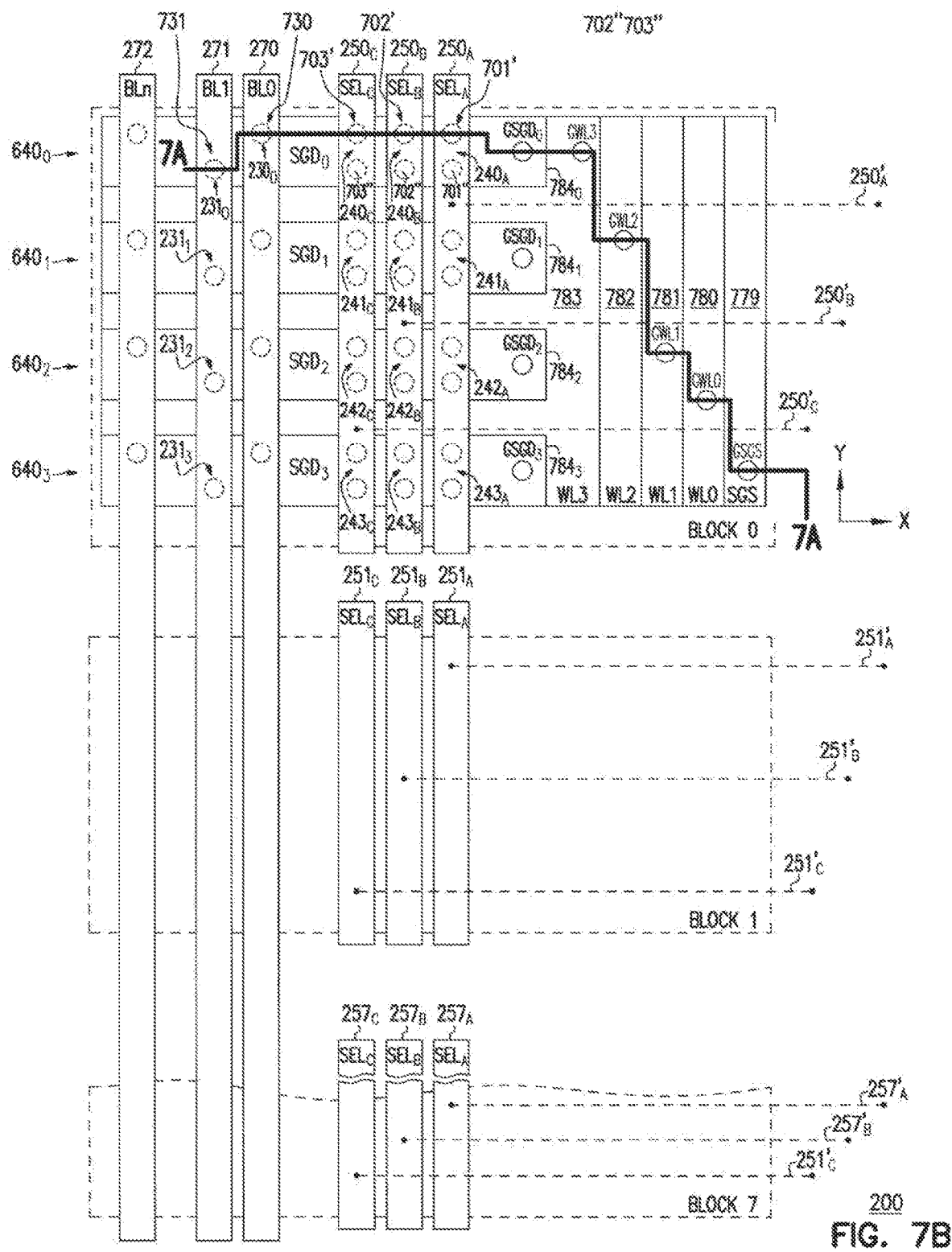
FIG. 7B shows a top view (in the x-y directions) of a structure of a portion of the memory device of FIG. 7A, according to some embodiments described herein.

FIG. 7B shows a top view (in the x-y directions) of a structure of a portion of memory device 200 of FIG. 2A, FIG. 6B through FIG. 6E, and FIG. 7A, according to some embodiments described herein. As mentioned above, the side view of a portion of memory device 200 (described above) is taken along line 7A-7A in FIG. 7B.

As shown in FIG. 7B, block 0 through block 7 of memory device 200 can be arranged (e.g., sequentially arranged) in the y-direction and can share data lines 270, 271, and 272. Each of data lines 270, 271, and 272 can include a conductive material and can have a length extending in the y-direction, which is perpendicular to the x-direction.

Each of block 0 through block 7 has its own transistor gate lines, such as transistor gate lines $250_A$, $250_B$, and $250_C$ (in block 0), transistor gate lines $251_A$, $251_B$, and $251_C$ (in block 1), and transistor gate lines $257_A$, $257_B$, and $257_C$ (in block 7). Each of the transistor gate lines can include a conductive material and can have a length extending in the y-direction.

Each of block 0 through block 7 has its own conductive connections (shown as dashed lines), such as conductive connections $250'_A$, $250'_B$, $250'_C$, $251'_A$, $251'_B$, $251'_C$, $257'_A$, $257'_B$, and $257'_C$. Each of these conductive connections can include a conductive material formed over (and electrically coupled to) a respective transistor gate line. Each of these conductive connections can have a length extending in the x-direction.

For simplicity, the following description of FIG. 7B focuses on the structures of block 0. Block 1 through block 7 of memory device 200 have similar structures.

As shown in FIG. 7B, sub-blocks $640_0$, $640_1$, $640_2$, and $640_3$ can share the select line (e.g., source select line) associated with signal SGS, and the control lines associated signals WL0, WL1, WL2, and WL3. Sub-blocks $640_0$, $640_1$, $640_2$, and $640_3$ have separate select lines (e.g., drain select lines) $280_0$, $280_1$, $280_2$, and $280_3$ that are formed from separate semiconductor materials $784_0$, $784_1$, $784_2$, and $784_3$ that are electrically uncoupled to each other. Semiconductor materials $784_0$, $784_1$, $784_2$, and $784_3$ can be located over semiconductor material 783 (over semiconductor materials 779 through 783).

The locations of memory cell strings (and associated pillars) of sub-blocks $640_0$, $640_1$, $640_2$, and $640_3$ relative to the locations of other structures of block 0 are shown in FIG. 7B. For example, in sub-block $640_0$, pillar 730 and associated memory cell string $230_0$ can be located under (and coupled to) data line 270. Pillar 731 and associated memory cell string $231_0$ can be located under (and coupled to) data line 271. Other memory cell strings $231_1$, $231_2$, and $231_3$ (and their associated pillars) of respective sub-blocks $640_1$, $640_2$, and $640_3$ are also shown in FIG. 7B.

The locations of transistors $240_A$, $240_B$, and $240_C$ (and associated pillars) of sub-blocks $640_0$, $640_1$, $640_2$, and $640_3$ relative to the locations of other structures of block 0 are shown in FIG. 7B. For example, in sub-block $640_0$, transistors $240_A$, $240_B$, and $240_C$ and associated pillars 701', 702', and 703' can be located under (and coupled to) transistor gate lines $250_A$, $250_B$, and $250_C$, respectively. Similarly, other transistors $241_A$, $241_B$, $241_C$, $242_A$, $242_B$, $242_C$, $243_A$, $243_B$, and $243_C$ and their associated pillars (not labeled)) of sub-blocks $640_1$, $640_2$, and $640_3$ are also shown in FIG. 7B.

Figure 7C:
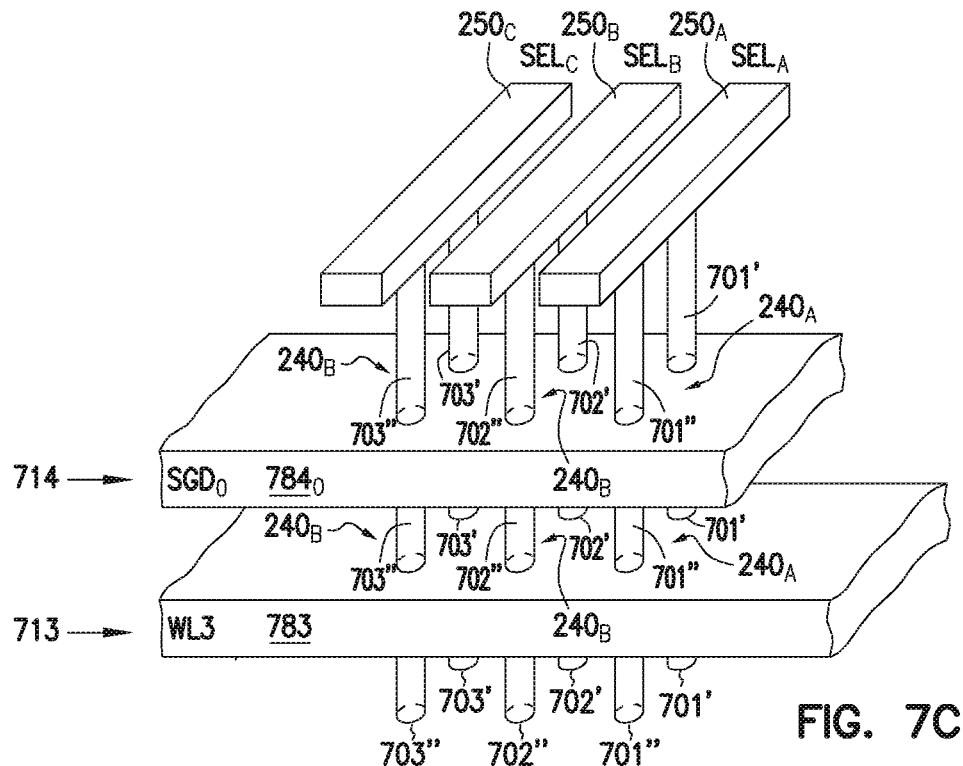
FIG. 7C shows a perspective view of a portion of the memory device of FIG. 7A and FIG. 7B including pass transistors and associated gate structures, according to some embodiments described herein.

FIG. 7C shows a perspective view of a portion of memory device 200 of FIG. 7A and FIG. 7B, according to some embodiments described herein. For simplicity, FIG. 7C shows a portion of memory device 200 that includes two semiconductor materials 783 and $784_0$ located in two respective levels (e.g., tiers) 713 and 714 of memory device 200. Other portions of memory device 200 of FIGS. 7A and 7B are omitted from FIG. 7C.

Figure 7D:
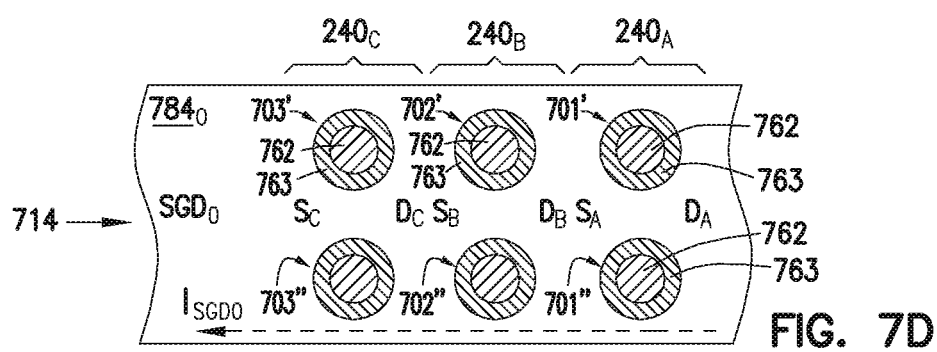
FIG. 7D shows a top view of a level (e.g., a tier) of the portion of the memory device of FIG. 7C including a group of pass transistors and a select line of the memory device, according to some embodiments described herein.
Figure 7E:
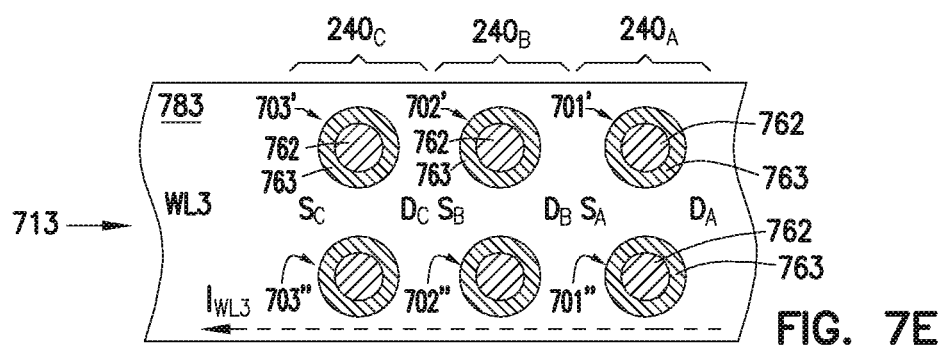
FIG. 7E shows a top view of another level (e.g., another tier) of the portion of the memory device of FIG. 7C including another group of pass transistors and a control line of the memory device, according to some embodiments described herein.

FIG. 7D shows a top view of level 714 the memory device 200 of FIG. 7C including a group of transistors $240_A$, $240_B$, and $240_C$ and the select line $280_0$ (e.g., drain select line associated with signal $SGD_0$) formed from portions of semiconductor material $784_0$. FIG. 7E shows a top view of level 713 of the memory device 200 of FIG. 7C including another group of transistors $240_A$, $240_B$, and $240_C$ and the control gate (associated with signal WL3) formed from portions of semiconductor material 783.

The following description focuses on transistor $240_A$ in level 714 (FIG. 7C and FIG. 7D). Transistor $240_A$ in level 713 and other transistors $240_B$ and $240_C$ have similar structures that are described after the description of transistor $240_A$ in level 714.

In FIG. 7C, different portions of pillars 701' and 701" can form a gate of transistor $240_A$ on level 714. For example, the portions of pillars 701' and 701" that are embedded in (e.g., surrounded by) semiconductor material $784_0$ can form the gate of transistor $240_A$ in level 714. Portions $S_A$ and $D_A$ (in FIG. 7D) of semiconductor material $784_0$ can form respective source and drain of transistor $240_A$ on level 714. As shown in FIG. 7C and FIG. 7D, transistor $240_A$ in level 714 can include a multi-gate structure, in which a portion of the multi-gate structure is formed from a portion of pillar 701', and another portion of the multi-gate structure is formed from a portion of pillar 701". Thus, the multi-gate structure of transistor $240_A$ includes two portions of respective pillars 701' and 701" in which the two portions are electrically coupled to each other by transistor gate line $250_A$.

As shown in FIG. 7D, each of pillars 701' and 701" can include a material 762 and a material 763. Material 763 electrically separates material 762 from semiconductor material $784_0$. Material 762 of pillars 701' and 701" can form a gate of transistor $240_A$ in level 714. Material 763 of pillars 701' and 701" can form a gate-oxide (a dielectric between the gate and the body (channel)) of transistor $240_A$ in level 714. Material 762 can include a conductive material (e.g., conductively doped polycrystalline silicon of n-type conductivity, or other conductively doped semiconductor materials). Material 763 can include a dielectric material (e.g., silicon dioxide). Material 762 of pillar 701' and material 762 of pillar 701" can form two respective portions of the multi-gate structure of transistor $240_A$.

Similarly, in FIG. 7C, different portions of pillars 702' and 702" can form a gate of transistor $240_B$ on level 714. For example, the portions of pillars 702' and 702" that are embedded in (e.g., surrounded by) semiconductor material $784_0$ can form the gate of transistor $240_B$ in level 714. Portions $S_B$ and $D_B$ (in FIG. 7D) of semiconductor material $784_0$ can form respective source and drain of transistor $240_B$ on level 714. As shown in FIG. 7C and FIG. 7D, transistor $240_B$ in level 714 can include a multi-gate structure, in which a portion of the multi-gate structure is formed from a portion of pillar 702', and another portion of the multi-gate structure is formed from a portion of pillar 702". Thus, the multi-gate structure of transistor $240_B$ includes two portions of respective pillars 702' and 702" in which the two portions are electrically coupled to each other by transistor gate line $250_B$. As shown in FIG. 7D, each of pillars 702' and 702" can include a material 762 and a material 763. Material 762 of pillars 702' and 702" can form a gate of transistor $240_B$ in level 714. Material 763 of pillars 702' and 702" can form a gate-oxide (a dielectric between the gate and the body (channel)) of transistor $240_B$ in level 714. Material 762 of pillar 702' and material 762 of pillar 702" can form two respective portions of the multi-gate structure of transistor $240_B$.

In FIG. 7C, different portions of pillars 703' and 703" can form a gate of transistor $240_C$ on level 714. For example, the portions of pillars 703' and 703" that are embedded in (e.g., surrounded by) semiconductor material $784_0$ can form the gate of transistor $240_C$ in level 714. Portions $S_C$ and $D_C$ (in FIG. 7D) of semiconductor material $784_0$ can form respective source and drain of transistor $240_C$ on level 714. As shown in FIG. 7C and FIG. 7D, transistor $240_C$ in level 714 can include a multi-gate structure, in which a portion of the multi-gate structure is formed from a portion of pillar 703', and another portion of the multi-gate structure is formed from a portion of pillar 703". Thus, the multi-gate structure of transistor $240_C$ includes two portions of respective pillars 703' and 703" in which the two portions are electrically coupled to each other by transistor gate line $250_C$. As shown in FIG. 7D, each of pillars 703' and 703" can include a material 762 and a material 763. Material 762 of pillars 703' and 703" can form a gate of transistor $240_C$ in level 714. Material 763 of pillars 703' and 703" can form a gate-oxide (a dielectric between the gate and the body (channel)) of transistor $240_C$ in level 714. Material 762 of pillar 703' and material 762 of pillar 703" can form two respective portions of the multi-gate structure of transistor $240_C$.

In FIG. 7D, current $I_{SGD0}$ indicates a current going through transistors $240_A$, $240_B$, and $240_C$ (e.g., by way of a conductive path formed by the sources and drains (e.g., $S_A$, $D_A$, $S_B$, $D_B$, $S_C$, and $D_C$) of transistors $240_A$, $240_B$, and $240_C$ (series-connected transistors)) in level 714 during a memory operation of memory device 200 when all of transistors $240_A$, $240_B$, and $240_C$ in level 714 are turned on. As described above, $240_A$, $240_B$, and $240_C$ can be turned on by providing a positive voltage to each of signals $SEL_A$, $SEL_B$, and $SEL_C$. Current $I_{SGD0}$ in FIG. 7D can be discontinued (e.g., in order to not to form a conductive path through transistors $240_A$, $240_B$, and $240_C$) when at least one of transistors $240_A$, $240_B$, and $240_C$ is turned off (e.g., by providing zero volts or alternatively a negative positive voltage to at least one of signals $SEL_A$, $SEL_B$, and $SEL_C$).

In FIG. 7C and FIG. 7E, transistors $240_A$, $240_B$, and $240_C$ in level 713 have similar structures as transistors $240_A$, $240_B$, and $240_C$, respectively, in level 714. As shown in FIG. 7C, the gates of transistors $240_A$, $240_B$, and $240_C$ can be formed from respective portions of pillars 701' and 701", portions of pillars 702' and 702", and portions of pillars 703' and 703" that are embedded in semiconductor material 783. As shown in FIG. 7E, the sources and drains of transistors $240_A$, $240_B$, and $240_C$ in level 713 can be formed from portions $S_A$ and $D_A$, portions $S_B$ and $D_B$, and portions $S_C$ and $D_C$, respectively, of semiconductor material 783.

In FIG. 7E, current $I_{WL3}$ indicates a current going through transistors $240_A$, $240_B$, and $240_C$ (e.g., by way of a conductive path formed by the sources and drains (e.g., $S_A$, $D_A$, $S_B$, $D_B$, $S_C$, and $D_C$) of transistors $240_A$, $240_B$, and $240_C$ (series-connected transistors)) in level 713 during a memory operation of memory device 200 when all of transistors $240_A$, $240_B$, and $240_C$ in level 713 are turned on. As described above, $240_A$, $240_B$, and $240_C$ can be turned on by providing a positive voltage to each of signals $SEL_A$, $SEL_B$, and $SEL_C$. Current $I_{WL3}$ in FIG. 7E can be discontinued (e.g., in order to not to form a conductive path through transistors $240_A$, $240_B$, and $240_C$) when at least one of transistors $240_A$, $240_B$, and $240_C$ is turned off (e.g., by providing zero volts or alternatively a negative positive voltage to at least one of signals $SEL_A$, $SEL_B$, and $SEL_C$).

As described above, transistor $240_A$ in level 713 and transistor $240_A$ in level 714 include gates that are formed from a portion of the same pillars (e.g., 701' and 702"). Thus, transistor $240_A$ in level 713 and transistor $240_A$ in level 714 can share the same gate (a gate formed from pillars 701' and 701") and can be controlled by the same signal $SEL_A$. Although not shown in FIG. 7C, FIG. 7D, and FIG. 7E, transistors $240_A$ in other levels 709 through 712 (FIG. 7A) of memory device 200 can also share the same gate (a gate formed from pillars 701' and 701") with transistors $240_A$ in levels 713 and 714 (FIG. 7C).

Similarly, transistor $240_B$ in level 713 and transistor $240_B$ in level 714 (and transistors $240_B$ in other levels 709 through 712 (not show in FIG. 7C)) can share the same gate (a gate formed from pillars 702' and 702") and can be controlled by the same signal $SEL_B$. Transistor $240_C$ in level 713 and transistor $240_C$ in level 714 (and transistors $240_C$ in other levels 709 through 712 (not show in FIG. 7C)) can share the same gate (gate formed from pillars 703' and 703") and can be controlled by the same signal $SEL_C$.

As shown in FIG. 7A through FIG. 7E, parts (e.g., sources and drains) of the pass transistors (e.g., transistors $240_A$, $240_B$, and $240_C$) of memory device 200 are formed from the same semiconductor materials (e.g., semiconductor materials 779, 780, 781, 782, 783, $784_0$, $784_1$, $784_2$, $784_3$,) that are used to form parts of other components of memory device 200, such as local drain select lines $280_0$, $280_1$, $280_2$, and $280_3$, and control lines (e.g., local access lines) 220, 221, 222, 223, $280_0$, and $280_1$, and local source select line $280'_0$. Thus, portions (e.g., sources and drains) of the pass transistors of memory device 200 are already present (e.g., are built-in components) semiconductor materials 779, 780, 781, 782, 783, $784_0$, $784_1$, $784_2$, $784_3$. Locating the pass transistors (e.g., transistors $240_A$, $240_B$, and $240_C$) in the described memory device in ways shown in FIG. 7A through FIG. 7E may provide further improvements over some conventional memory devices. For example, some conventional memory devices may include transistors in the substrate. Such transistors may need additional processing steps to form parts (e.g., sources and drains) of the transistors, whereas parts (e.g., sources and drains) of the pass transistors of the described memory device (e.g., memory device 200 or 400) can be formed from the same materials (e.g., semiconductor materials 779, 780, 781, 782, 783, $784_0$, $784_1$, $784_2$, $784_3$) that are used to form other components of the described memory device. Besides the improvements of the described memory device based on the locations of the pass transistors, the described memory device also has other improvements mentioned above (e.g., in the description of FIG. 1).

Figure 8:
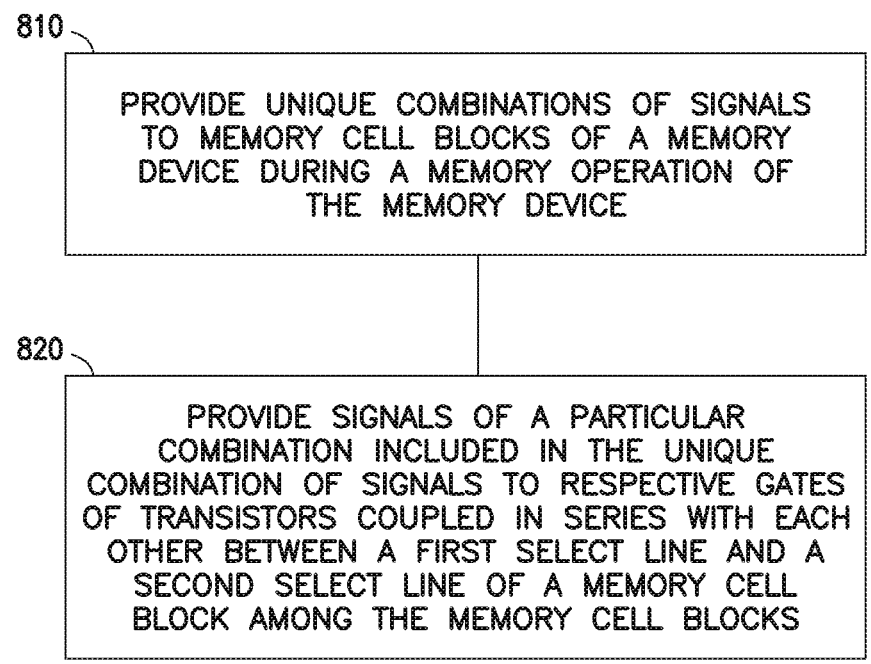
FIG. 8 is a flowchart showing a method of operating a memory device, according to some embodiments described herein.

FIG. 8 is a flowchart showing a method 800 of operating a memory device, according to some embodiments described herein. The memory device used in method 800 can be memory device 100 (FIG. 1), memory device 200 (FIG. 2A), or memory device 400 (FIG. 4A). Method 800 can be implemented in software, firmware, or hardware, or any combination of software, firmware, and hardware. For example, the software, firmware, or hardware, or any combination of software, firmware, and hardware that performs method 800 can be part of a control unit of the memory device used in method 800 (the control unit can be similar to control unit 118 of FIG. 1). A portion of method 800 or the entire method 800 can be part of an algorithm implemented in such a control unit of the memory device used in method 800.

As shown in FIG. 8, method 800 can include activities 810 and 820. Activity 810 can include providing unique combinations of signals to memory cell blocks of a memory device during a memory operation of the memory device. An example of the unique combinations of signals in activity 810 can include different combinations of signals $SEL_1$, $SEL_2$, $SEL_3$, $SEL^*_1$, $SEL^*_2$, and $SEL^*_3$ provided to block 0 through block 7 shown in chart 245 of FIG. 2B. Another example of the unique combinations of signals in activity 810 can include different combinations of signals $SEL_1$, $SEL_2$, $SEL_3$, $SEL_4$, $SEL^*_1$, $SEL^*_2$, $SEL^*_3$, and $SEL^*_4$ provided to block 0 through block 15 shown in chart 445 of FIG. 4B. In activity 810, the unique combinations of signals can be provided to the memory cell blocks, such that each of the memory cell blocks can receive one of the unique combinations of the signals.

As shown in FIG. 8, activity 820 can include providing signals from a particular combination included in the unique combinations of signals to respective gates of transistors coupled in series with each other between a first select line and a second select line of a memory cell block among the memory cell blocks. An example of signals of the particular combination in activity 820 can include three of six signals $SEL_1$, $SEL_2$, $SEL_3$, $SEL^*_1$, $SEL^*_2$, and $SEL^*_3$ provided to one of block 0 through block 7 shown in chart 245 of FIG. 2B. Another example of the particular combination in activity 820 can include four of eight signals $SEL_1$, $SEL_2$, $SEL_3$, $SEL_4$, $SEL^*_1$, $SEL^*_2$, $SEL^*_3$, and $SEL^*_4$ provided to one of block 0 through block 15 shown in chart 445 of FIG. 4B. In activity 820, a first signal of the signals of the particular combination can be provided to a gate of a first transistor of the transistors, and a second signal of the signals of the particular combination can be provided to a gate of a second transistor of the transistors. For example, if block 0 in FIG. 2B is the memory cell block in activity 820, then first and second signals can be any two of signals $SEL_1$, $SEL_2$, and $SEL_3$. In this example, signals $SEL_1$ and $SEL_2$ can be the first and second signals, respectively, and can be provided to the gates of transistors $240_A$ and $240_B$ (through respective transistor gate lines $250_A$ and $250_B$ (e.g., FIG. 6B)). In this example, signal $SEL_3$ can be considered as a third signal of the particular combination. The third signal (e.g., signal $SEL_3$ in this example) of the particular combination can be provided to a gate of transistor $240_C$ (through transistor gate line $250_C$ (e.g., FIG. 6B)).

Method 800 described above can include fewer or more activities relative to activities 810 and 820 shown in FIG. 8. For example, method 800 can include activities and operations of any of the memory devices (e.g., memory device 100, 200, or 400) described above with reference to FIG. 1 through FIG. 7E.

The illustrations of apparatuses (e.g., memory devices 100, 200, and 400) and methods (e.g., methods of operating memory devices 100, 200, and 400) are intended to provide a general understanding of the structure of various embodiments and are not intended to provide a complete description of all the elements and features of apparatuses that might make use of the structures described herein. An apparatus herein refers to, for example, either a device (e.g., memory devices 100, 200, and 400) or a system (e.g., a computer, a cellular phone, or other electronic system) that includes a device such as memory devices 100, 200, and 400.

Memory devices 100, 200, and 400 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 8 include apparatuses and methods of operating the apparatuses. One of the apparatuses includes a semiconductor material, a pillar extending through the semiconductor material, a select gate located along a first portion of the pillar, memory cells located along a second portion of the pillar, and transistors including sources and drains formed from portions of the semiconductor material. The transistors include gates that are electrically uncoupled to each other. Other embodiments including additional apparatuses and methods are described.

In the detailed description and the claims, a list of items joined by the term "at least one of" can mean any combination of the listed items. For example, if items A and B are listed, then the phrase "at least one of A and B" can mean A only; B only; or A and B. In another example, if items A, B, and C are listed, then the phrase "at least one of A, B and C" can mean A only; B only; C only; A and B (without C); A and C (without B); B and C (without A); or all of A, B, and C. Item A can include a single element or multiple elements. Item B can include a single element or multiple elements. Item C can include a single element or a multiple elements.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
a data line extending in a first direction;
a memory cell string;
a select gate coupled between the data line and the memory cell string;
a first select line to control the select gate;
a second select line to receive a signal;
transistors including a first transistor, a second transistor, and a third transistor coupled in series with each other and coupled between the first and second select lines, the transistors including different gates, wherein the transistors are part of a conductive path between the first select line and the second select line; and
pillars extending in a second direction, wherein part of a first pillar of the pillars forms a gate of the first transistor, part of a second pillar of the pillars forms a gate of the second transistor, and part of a third pillar of the pillars forms a gate of the third transistor.

2. The memory device of claim 1, wherein further comprising:
levels of first materials formed over a substrate of the memory device, the levels of first material forming control lines coupled to the memory cells of the memory cell string; and
a level of second material located over the levels of first materials, wherein the select line is included in the level of second material.

3. The memory device of claim 2, wherein part of the transistors is included in the level of second material.

4. The memory device of claim 2, wherein the transistors include sources and drains, and the sources and drains are included in the level of second material.

5. An apparatus comprising:
a data line;
a memory cell string;
a select gate coupled between the data line and the memory cell string;
a first select line to control the select gate;
a second select line to receive a signal; and
transistors coupled in series with each other and coupled between the first and second select lines, the transistors including different gates;
levels of first materials formed over a substrate of the memory device, the levels of first material forming control lines coupled to the memory cells of the memory cell string; and
a level of second material located over the levels of first materials, wherein the select line is included in the level of second material;
a first pillar extending through the levels of first materials and the level of second material, wherein part of the first pillar forms a gate of a first transistor of the transistors; and
a second pillar extending through the levels of first materials and the level of second material, wherein part of the second pillar forms a gate of a second transistor of the transistors.

6. The memory device of claim 1, further comprising:
a first conductive line coupled to a gate of the first transistor of the transistors; and
a second conductive line coupled to a gate of the second transistor of the transistors; and a third conductive line coupled to a gate of the third transistor of the transistors.

7. The memory device of claim 1, further comprising:
an additional memory cell string including memory cells located in different levels of the memory device;
an additional select gate coupled between the data line and the additional memory cell string;
a first additional select line to control the additional select gate;
a second additional select line to receive an additional signal;
additional transistors coupled in series with each other and coupled between the first and second additional select lines, the transistors including different gates;
first conductive lines coupled to gates of the transistors;
second conductive lines coupled to gates of the additional transistors; and
routing circuitry including additional conductive lines, wherein the first conductive lines are coupled to a first combination of the additional conductive lines, and the second conductive lines are coupled to a second combination of the additional conductive lines.

8. The memory device of claim 7, wherein:
the memory cell string, the select gate, the first and second select lines, and the transistors are included in a first block of the memory device; and
the additional memory cell string, the additional select gate, the first and second additional select lines, and the additional transistors are included in a second block of the memory device.

9. A memory device comprising:
a data line extending in a first direction;
a memory cell string including memory cells located in different levels of the memory device;
a control line coupled to a memory cell of the memory cells;
an access line to receive a signal;
transistors including a first transistor, a second transistor, and a third transistor coupled in series with each other and coupled between the control line and the access line, the transistors including different gates, wherein the transistors are part of a conductive path between the control line and the access line; and
pillars extending in a second direction, wherein part of a first pillar of the pillars forms a gate of the first transistor, part of a second pillar of the pillars forms a gate of the second transistor, and part of a third pillar of the pillars forms a gate of the third transistor.

10. The memory device of claim 9, wherein further comprising:
a level of material formed over a substrate of the memory device, wherein the control line is included in the level of material, and part of the transistors is included in the level of material.

11. The memory device of claim 10, wherein the transistors include sources and drains, and the sources and drains are included in the level of material.

12. The memory device of claim 9, further comprising:
a first conductive line coupled to a gate of the first transistor of the transistors; and
a second conductive line coupled to a gate of the second transistor of the transistors and a third conductive line coupled to a gate of the third transistor of the transistors.

13. The memory device of claim 9, further comprising:
an addition control line coupled to an additional memory cell of the memory cells;

an additional access line to receive an addition signal; and
additional transistors including a first additional transistor, a second additional transistor, and a third additional transistor coupled in series with each other and coupled between the additional control line and the additional access line, the additional transistors different gates.

14. The memory device of claim 13, wherein:
the gate of the first transistor is coupled to a gate of the first additional transistor of the additional transistors;
the gate of the second transistor is coupled to a gate of the second additional transistor of the additional transistors; and
the gate of the third transistor is coupled to a gate of the third additional transistor of the additional transistors.

15. The memory device of claim 14, further comprising:
a first conductive line coupled to the gate of the first transistor of the transistors;
a second conductive line coupled to the gate of the second transistor of the transistors; and
a third conductive line coupled to the gate of the third transistor of the transistors.

16. A memory device comprising:
a data line;
a memory cell string including memory cells located in different levels of the memory device;
a first select gate coupled between the data line and the first memory cell string;
a first select line to control the first select gate;
a first additional select line to receive a first signal;
first transistors coupled in series with each other and coupled between the first select line and the first additional select line, wherein the first transistors are part of a conductive path between the first select line and the first additional select line;
a second memory cell string memory cells located in different levels of the memory device;
a second select gate coupled between the data line and the second memory cell string;
a second select line to control the second select gate;
a second additional select line to receive a second signal;
second transistors coupled in series with each other and coupled between the second select line and the second additional select line, wherein the second transistors are part of a conductive path between the second select line and the second additional select line;
a first conductive line coupled to a gate of a first transistor of the first transistors and to a gate of a first transistor of the second transistors; and
a second conductive line coupled to a gate of a second transistor of the first transistors and to a gate of a second transistor of the second transistors.

17. A memory device comprising:
a data line;
a memory cell string including memory cells located in different levels of the memory device;
a first select gate coupled between the data line and the first memory cell string;
a first select line to control the first select gate;
a first additional select line to receive a first signal;
first transistors coupled in series with each other and coupled between the first select line and the first additional select line;
a second memory cell string memory cells located in different levels of the memory device;
a second select gate coupled between the data line and the second memory cell string;
a second select line to control the second select gate;

a second additional select line to receive a second signal;
second transistors coupled in series with each other and coupled between the second select line and the second additional select line;
a first conductive line coupled to a gate of a first transistor of the first transistors and to a gate of a first transistor of the second transistors; and
a second conductive line coupled to a gate of a second transistor of the first transistors and to a gate of a second transistor of the second transistors;
levels of materials forming control lines coupled to the memory cells of the first and second memory cell strings;
a level of first additional material located over the levels of materials, wherein part of the first transistors is included in the level of first additional material;
a level of second additional material located over the levels of materials and located on a same level as the level of first additional material, wherein part of the second transistors is included in the level of second additional material.

18. A memory device comprising:
a data line;
a memory cell string including memory cells located in different levels of the memory device;
a first select gate coupled between the data line and the first memory cell string;
a first select line to control the first select gate;
a first additional select line to receive a first signal;
first transistors coupled in series with each other and coupled between the first select line and the first additional select line;
a second memory cell string memory cells located in different levels of the memory device;
a second select gate coupled between the data line and the second memory cell string;
a second select line to control the second select gate;
a second additional select line to receive a second signal;
second transistors coupled in series with each other and coupled between the second select line and the second additional select line;
a first conductive line coupled to a gate of a first transistor of the first transistors and to a gate of a first transistor of the second transistors; and
a second conductive line coupled to a gate of a second transistor of the first transistors and to a gate of a second transistor of the second transistors;
a first pillar extending through the levels of materials and the level of first additional material, wherein part of the first pillar forms the gate of the first transistor of the first transistors;
a second pillar extending through the levels of materials and the level of second additional material, wherein part of the second pillar forms the gate of the first transistor of the second transistors;
a first additional pillar extending through the levels of materials and the level of first additional material, wherein part of the first additional pillar forms the gate of the second transistor of the first transistors; and
a second additional pillar extending through the levels of materials and the level of second additional material, wherein part of the second additional pillar forms the gate of the second transistor of the second transistors.

19. The memory device of claim 16, wherein the first transistors and the second transistors are configured to turn on during an operation of the memory device based on a first combination of signals on the first and second conductive lines.

20. The memory device of claim 19, wherein the first transistors and the second transistors are configured to turn off during an additional operation of the memory device based on a second combination of signals on the first and second conductive lines.

* * * * *